United States Patent
Lee et al.

(10) Patent No.: US 12,132,019 B2
(45) Date of Patent: *Oct. 29, 2024

(54) PACKAGED MULTI-CHIP SEMICONDUCTOR DEVICES AND METHODS OF FABRICATING SAME

(71) Applicant: Samsung Electronics Co., Ltd., Suwon-si (KR)

(72) Inventors: Hyuekjae Lee, Hwaseong-si (KR); Jongho Lee, Hwaseong-si (KR); Jihoon Kim, Cheonan-si (KR); Taehun Kim, Asan-si (KR); Sangcheon Park, Hwaseong-si (KR); Jinkyeong Seol, Cheonan-si (KR); Sanghoon Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 15 days.

This patent is subject to a terminal disclaimer.

(21) Appl. No.: 18/151,622

(22) Filed: Jan. 9, 2023

(65) Prior Publication Data

US 2023/0163088 A1 May 25, 2023

Related U.S. Application Data

(63) Continuation of application No. 17/155,657, filed on Jan. 22, 2021, now Pat. No. 11,552,033.

(30) Foreign Application Priority Data

May 18, 2020 (KR) .......................... 10-2020-0059328

(51) Int. Cl.
*H01L 21/56* (2006.01)
*H01L 23/00* (2006.01)
(Continued)

(52) U.S. Cl.
CPC ............ *H01L 24/06* (2013.01); *H01L 21/561* (2013.01); *H01L 24/05* (2013.01); *H01L 24/08* (2013.01);
(Continued)

(58) Field of Classification Search
CPC ....... H01L 21/561; H01L 24/94; H01L 24/06; H01L 2224/13024
See application file for complete search history.

(56) References Cited

U.S. PATENT DOCUMENTS 9,368,474 B2 6/2016 Matsubara et al.
9,773,768 B2 9/2017 Yu et al.
(Continued)

FOREIGN PATENT DOCUMENTS

KR 20200047845 A 5/2020
KR 20200047846 A 5/2020

*Primary Examiner* — Dale E Page
*Assistant Examiner* — Ilner Jean Baptiste
(74) *Attorney, Agent, or Firm* — Myers Bigel, P.A.

(57) ABSTRACT

A semiconductor package includes a first connection structure, a first semiconductor chip on an upper surface of the first connection structure, a first molding layer on the upper surface of the first connection structure and surrounding the first semiconductor chip, a first bond pad on the first semiconductor chip, a first bond insulation layer on the first semiconductor chip and the first molding layer and surrounding the first bond pad, a second bond pad directly contacting the first bond pad, a second bond insulation layer surrounding the second bond pad; and a second semiconductor chip on the second bond pad and the second bond insulation layer.

20 Claims, 33 Drawing Sheets

(51) Int. Cl.
*H01L 25/00* (2006.01)
*H01L 25/065* (2023.01)
*H01L 25/18* (2023.01)

(52) U.S. Cl.
CPC .............. *H01L 24/13* (2013.01); *H01L 24/32* (2013.01); *H01L 24/92* (2013.01); *H01L 24/94* (2013.01); *H01L 24/96* (2013.01); *H01L 25/0652* (2013.01); *H01L 25/0655* (2013.01); *H01L 25/0657* (2013.01); *H01L 25/18* (2013.01); *H01L 25/50* (2013.01); *H01L 2224/05025* (2013.01); *H01L 2224/05073* (2013.01); *H01L 2224/05562* (2013.01); *H01L 2224/05564* (2013.01); *H01L 2224/06182* (2013.01); *H01L 2224/08121* (2013.01); *H01L 2224/08145* (2013.01); *H01L 2224/08148* (2013.01); *H01L 2224/08225* (2013.01); *H01L 2224/13024* (2013.01); *H01L 2224/32145* (2013.01); *H01L 2224/32225* (2013.01); *H01L 2224/80895* (2013.01); *H01L 2224/83099* (2013.01); *H01L 2224/8389* (2013.01); *H01L 2224/92142* (2013.01); *H01L 2225/06541* (2013.01); *H01L 2225/06548* (2013.01)

(56) References Cited

U.S. PATENT DOCUMENTS

| | | | |
|---|---|---|---|
| 10,032,756 | B2 | 7/2018 | Lin et al. |
| 10,153,222 | B2 * | 12/2018 | Yu ...................... H01L 25/0657 |
| 10,290,571 | B2 | 5/2019 | Yu et al. |
| 10,971,470 | B2 | 4/2021 | Kim et al. |
| 11,552,033 | B2 * | 1/2023 | Lee ......................... H01L 24/92 |
| 2016/0343695 | A1 | 11/2016 | Lin et al. |
| 2018/0366399 | A1 * | 12/2018 | Pietambaram .......... H01L 23/28 |
| 2019/0123088 | A1 | 4/2019 | Kwon |
| 2019/0333871 | A1 | 10/2019 | Chen et al. |
| 2020/0006241 | A1 | 1/2020 | Wu et al. |
| 2020/0135594 | A1 | 4/2020 | Lee et al. |
| 2020/0135684 | A1 | 4/2020 | Kim et al. |
| 2020/0135699 | A1 | 4/2020 | Hwang et al. |

\* cited by examiner

PACKAGED MULTI-CHIP SEMICONDUCTOR DEVICES AND METHODS OF FABRICATING SAME

REFERENCE TO PRIORITY APPLICATION

This application is a continuation of and claims priority to U.S. application Ser. No. 17/155,657, filed Jan. 22, 2021, which claims the benefit of Korean Patent Application No. 10-2020-0059328, filed May 18, 2020, the disclosures of which are hereby incorporated herein by reference.

BACKGROUND

The inventive concept relates to packaged semiconductor devices and, more particularly, to packaged multi-chip semiconductor devices.

High-performance and compact electronic devices have been continuously requested. Due to these requests, semiconductor packages including a plurality of semiconductor chips have been developed. For example, a plurality of semiconductor chips may be stacked in a vertical direction to thereby reduce the layout area of the semiconductor package and provide multi-functional and/or high-performance semiconductor packages.

SUMMARY

The inventive concept provides an integrated circuit package in which a plurality of semiconductor chips are connected via direct bonding without bumps, and a method of manufacturing the integrated circuit package.

According to an aspect of the inventive concept, there is provided a packaged semiconductor device, which includes a first connection structure, a first semiconductor chip on an upper surface of the first connection structure, a first molding layer located on the upper surface of the first connection structure and surrounding the first semiconductor chip, a first bond pad on the first semiconductor chip, a first bond insulation layer located on the first semiconductor chip and the first molding layer and surrounding the first bond pad, a second bond pad directly contacting the first bond pad, a second bond insulation layer surrounding the second bond pad; and a second semiconductor chip on the second bond pad and the second bond insulation layer.

According to another aspect of the inventive concept, there is provided a packaged semiconductor device, which includes a redistribution structure, a solder bump on a lower surface of the redistribution structure, a first semiconductor chip located on an upper surface of the redistribution structure. This first semiconductor chip includes a substrate, a lower chip pad on a lower surface of the substrate, an upper chip pad on an upper surface of the substrate, and a through substrate via (TSV) extending between the lower chip pad and the upper chip pad by penetrating through the substrate. A first molding layer is also provided, which is located on the upper surface of the redistribution structure and at least partially surrounds the first semiconductor chip. A first bond pad is provided on the upper chip pad of the first semiconductor chip. A first bond insulation layer is provided, which is located on an upper surface of the first semiconductor chip and an upper surface of the first molding layer (and at least partially surrounds the first bond pad). A second bond pad is provided, which directly contacts the first bond pad. A second bond insulation layer is provided, which directly contacts the first bond insulation layer and surrounds the second bond pad. And, a second semiconductor chip is provided on the second bond pad and on the second bond insulation layer.

According to another aspect of the inventive concept, there is provided a packaged semiconductor device, which includes: a connection structure, a first semiconductor chip on an upper surface of the connection structure, a first bond pad on the first semiconductor chip, a first bond insulation layer located on the first semiconductor chip and at least partially surrounding the first bond pad, a second bond pad directly contacting the first bond pad, and a second bond insulation layer at least partially surrounding the second bond pad. A second semiconductor chip is also provided on the second bond pad and the second bond insulation layer. A first molding layer is provided, which is located on the second bond insulation layer and at least partially surrounds the second semiconductor chip.

According to another aspect of the inventive concept, there is provided a packaged semiconductor device, which includes a package substrate, an interposer on the package substrate, first and second bond pads on the interposer, and a first bond insulation layer located on the interposer and at least partially surrounding the first bond pad and the second bond pad. A third bond pad is also provided, which directly contacts the first bond pad, and a fourth bond pad is provided, which directly contacts the second bond pad. A second bond insulation layer is provided, which at least partially surrounds the third bond pad and the fourth bond pad. A first semiconductor chip is provided on the second bond insulation layer and the third bond pad, and a second semiconductor chip is provided on the second bond insulation layer and the fourth bond pad. A molding layer is provided, which is located on the second bond insulation layer and at least partially surrounds the first semiconductor chip and the second semiconductor chip.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
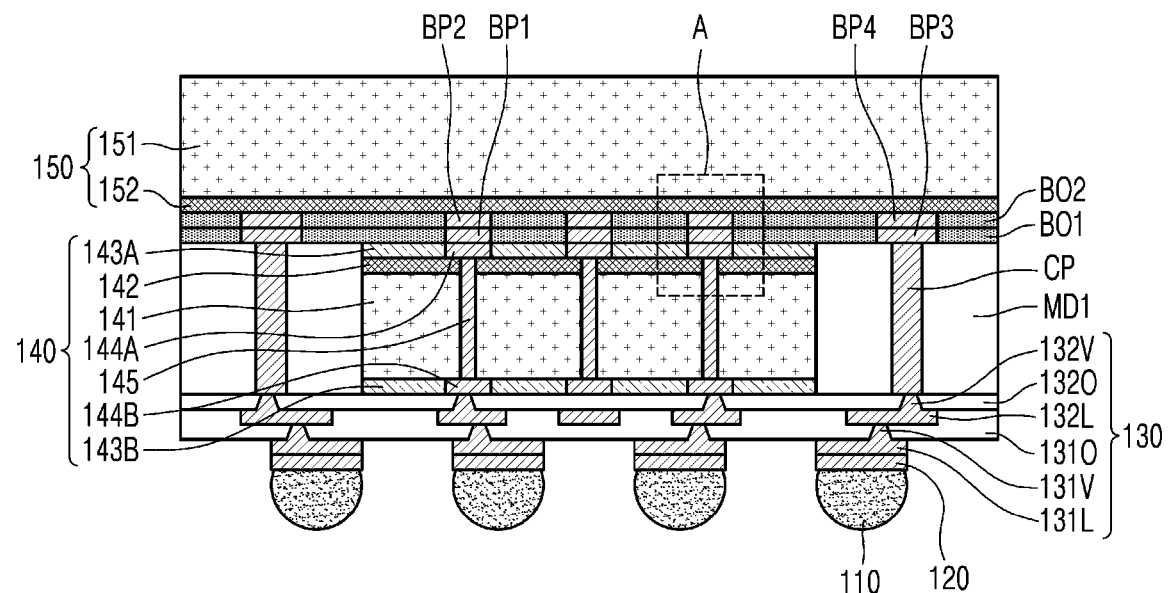
FIG. 1 is a cross-sectional view of a packaged semiconductor device according to an embodiment of the inventive concept.
Figure 2:
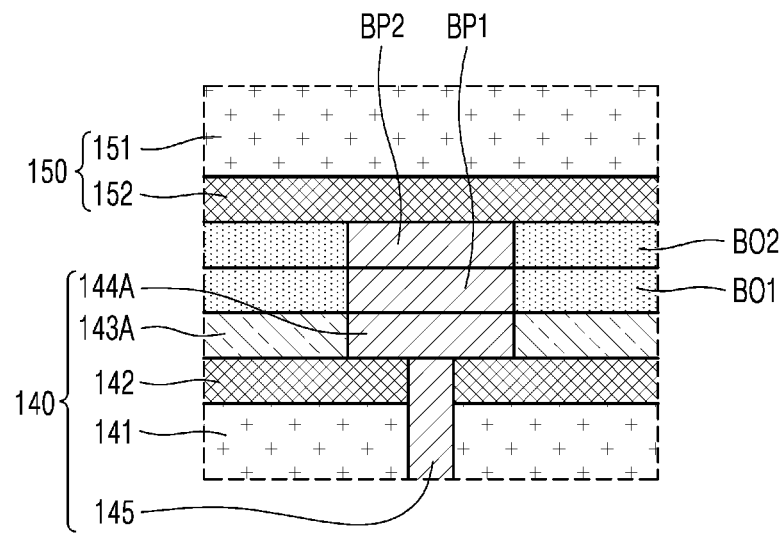
FIG. 2 is a magnified view of region A of FIG. 1.
Figure 3A:
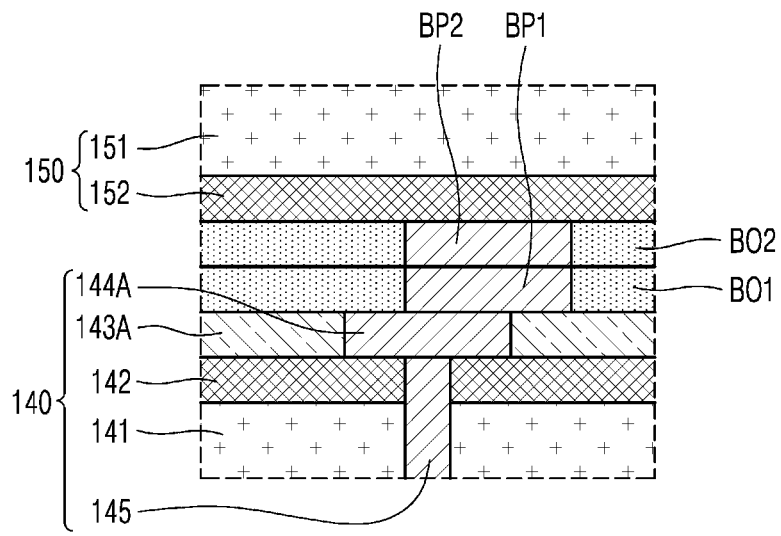
FIGS. 3A and 3B are magnified views of modifications of the region A of FIG. 1.
Figure 3B:
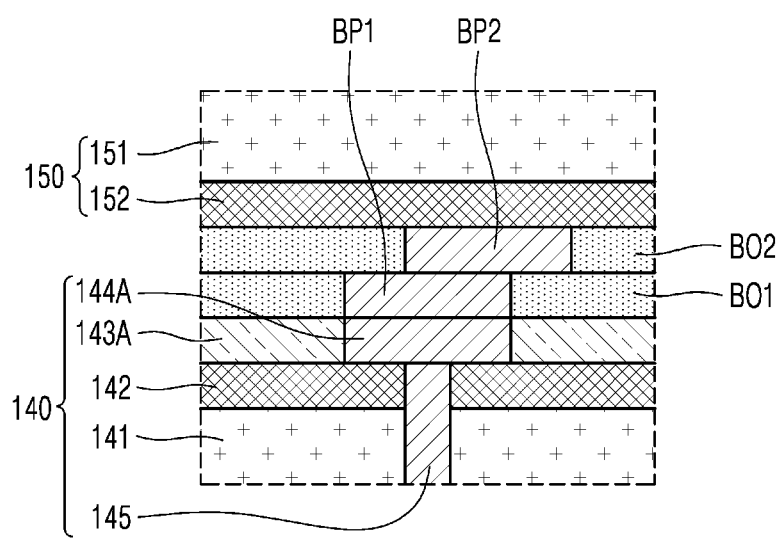

FIG. 1 is a cross-sectional view of a semiconductor package 100 according to an embodiment of the inventive concept. FIG. 2 is a magnified view of a region A of FIG. 1. FIGS. 3A and 3B are magnified views of modifications of the region A of FIG. 1.

Referring to FIGS. 1, 2, 3A, and 3B, the semiconductor package 100 may include a first connection structure 130, a first semiconductor chip 140 on an upper surface of the first connection structure 130, a first molding layer MD1 at least partially surrounding the first semiconductor chip 140, first bond pads BP1 on the first semiconductor chip 140, a first bond insulation layer BO1 on the first semiconductor chip 140 and the first molding layer MD1, second bond pads BP2 directly contacting the first bond pads BP1, a second bond insulation layer BO2 at least partially surrounding the second bond pads BP2, and a second semiconductor chip 150 on the second bond pads BP2 and the second bond insulation layer BO2.

According to some embodiments, the semiconductor package 100 may further include external connection terminal 110 on a lower surface of the first connection structure 130. According to some embodiments, the semiconductor package 100 may further include terminal pads 120 between the first connection structure 130 and the external connection terminals 110. According to some embodiments, the semiconductor package 100 may further include connection members CP that penetrate through the first molding layer MD1. According to some embodiments, the semiconductor package 100 may further include third bond pads BP3 on the connection members CP, and fourth bond pads BP4 directly contacting the third bond pads BP3.

The first connection structure 130 may connect the first semiconductor chip 140 and the second semiconductor chip 150 to the external connection terminals 110. According to some embodiments, the first connection structure 130 may be a redistribution structure. According to another embodiment, the first connection structure 130 may be an interposer or a printed circuit board (PCB). According to some embodiments in which the first connection structure 130 is a redistribution structure, the first connection structure 130 may be a redistribution layer (RDL) last structure. In other words, the first connection structure 130 may be formed on the first semiconductor chip 140 after the first semiconductor chip 140 is arranged on a carrier (not shown).

The first connection structure 130 may include, for example, a first insulation layer 132O on a lower surface of the first molding layer MD1, first conductive vias 132V penetrating through the first insulation layer 132O, first conductive patterns 132L on a lower surface of the first insulation layer 132O and contacting the first conductive vias 132V, a second insulation layer 131O on a lower surface of the first insulation layer 132O and lower surfaces of the first conductive patterns 132L, second conductive vias 131V contacting the first conductive patterns 132L by penetrating through the second insulation layer 131O, and second conductive patterns 131L on a lower surface of the second insulation layer 131O and contacting the second conductive vias 131V. Although the first connection structure 130 includes the first and second conductive patterns 132L and 131L corresponding to two layers and the two first and second insulation layers 131O and 132O in FIG. 1, the first connection structure 130 may include more conductive pattern layers and more insulation layers. According to some embodiments, the first conductive vias 132V and the first conductive patterns 132L may be integrally formed with each other. Similarly, the second conductive vias 131V and the second conductive patterns 131L may be integrally formed with each other. According to some embodiments, the terminal pads 120 may contact the second conductive patterns 131L. The connection members CP may contact the first conductive vias 132V, and second chip pads 144B of the first semiconductor chip 140 may contact other first conductive vias 132V. The first conductive vias 132V, the first conductive patterns 132L, the second conductive vias 131V, and the second conductive patterns 131L may form electrical paths.

According to some embodiments, the first insulation layer 132O and the second insulation layer 131O may include an insulating material, for example, silicon oxide, silicon nitride, or a combination thereof. The first conductive vias 132V, the first conductive patterns 132L, the second conductive vias 131V, and the second conductive patterns 131L may include a conductive material, for example, a metal material including copper (Cu), silver (Ag), gold (Au), tungsten (W), aluminum (Al), titanium (Ti), tantalum (Ta), or a combination thereof.

The first semiconductor chip 140 may be located on the upper surface of the first connection structure 130. The first semiconductor chip 140 may include a substrate 141, and a semiconductor device 142 on the substrate 141. An upper surface of the substrate 141 on which the semiconductor device 142 is formed may be referred to as an active surface, and a lower surface of the substrate 141 on which the semiconductor device 142 is not formed may be referred to as an inactive surface. The second semiconductor chip 150 may include a substrate 151, and a semiconductor device 152 on the substrate 151. A lower surface of the substrate 151 on which the semiconductor device 152 is formed may be referred to as an active surface, and an upper surface of the substrate 151 on which the semiconductor device 152 is not formed may be referred to as an inactive surface.

Each of the substrates 141 and 151 may include a semiconductor material such as a Group IV semiconductor material, Groups III and V semiconductor materials, or Groups II and VI semiconductor materials. The Group IV semiconductor material may include, for example, silicon (Si), germanium (Ge), or Si-Ge. The Groups III and V semiconductor materials may include, for example, gallium arsenide (GaAs), indium phosphorus (InP), gallium phosphorus (GaP), indium arsenide (InAs), indium antimony (InSb), or indium gallium arsenide (InGaAs). The Groups II and VI semiconductor materials may include, for example, zinc telluride (ZnTe) or cadmium sulfide (CdS).

Each of the semiconductor devices 142 and 152 may include, for example, a memory device and/or a logic device. For example, the memory device may be dynamic random access memory (DRAM), static random access memory (SRAM), flash memory, electrically erasable and programmable read-only memory (EEPROM), phase-change random access memory (PRAM), magnetic random access memory (MRAM), resistive random access memory (RRAM), or a combination thereof. The logic device may be, for example, a central processing unit (CPU), a graphics processing unit (GPU), a controller, an application specific integrated circuit (ASIC), an application processor (AP), or a combination thereof.

According to some embodiments, the first semiconductor chip 140 may further include through substrate vias (TSVs) that penetrate the substrate 141. According to some embodiments, the first semiconductor chip 140 may further include first chip pads 144A on the upper surface of the substrate 141, and second chip pads 144B on the lower surface of the substrate 141. According to some embodiments, the first semiconductor chip 140 may further include a first chip insulation layer 143A on the upper surface of the substrate 141 and a second insulation layer 143B on the lower surface of the substrate 141. The first chip pads 144A may be between the TSVs 145 and the first bond pads BP1. The second chip pads 144B may be between the TSVs 145 and the first connection structure 130. In other words, the TSVs 145 may extend between the first chip pads 144A and the second chip pads 144B. The first chip insulation layer 143A may at least partially surround the first chip pads 144A, and the second chip insulation layer 143B may at least partially surround the second chip pads 144B. The first chip pads 144A may be referred to as upper chip pads, and the second chip pads 144B may be referred to as lower chip pads. According to some embodiments, the second semiconductor chip 150 may further include chip pads between the semiconductor device 142 and the second bond pads BP2 and/or the semiconductor device 142 and the fourth bond pads BP4.

The first chip pads 144A, the second chip pads 144B, and the TSVs 145 may include a conductive material, for example, a metal material including copper (Cu), silver (Ag), gold (Au), tungsten (W), aluminum (Al), titanium (Ti), tantalum (Ta), or a combination thereof. The first chip insulation layer 143A and the second chip insulation layer 143B may include an insulating material, for example, silicon oxide, silicon nitride, polymer, or a combination thereof.

The second semiconductor chip 150 may be connected to the first semiconductor chip 140 via the second bond pads BP2 and the first bond pads BP1. The second semiconductor chip 150 may also be connected to the first connection structure 130 via the first semiconductor chip 140. For example, the second semiconductor chip 150 may be connected to the first connection structure 130 via the second bond pads BP2, the first bond pads BP1, the first chip pads 144A, the TSVs 145, and the second chip pads 144B. According to some embodiments, the second semiconductor chip 150 may be connected to the first connection structure 130 via the connection members CP instead of the first semiconductor chip 140. For example, the second semiconductor chip 150 may be connected to the first connection structure 130 via the fourth bond pads BP4, the third bond pads BP3, and the connection members CP.

The first molding layer MD1 may be located on the upper surface of the first connection structure 130 and may at least partially surround the first semiconductor chip 140. The first molding layer MD1 may support a temperature of about 300° C. or greater, may have a thermal expansion coefficient of about 10 ppm/° C. or less, and may include a material that has good adhesion with the first bond insulation layer BO1. The first molding layer MD1 may include, for example, an organic insulating material including epoxy resin, silicone resin, or a combination thereof. The first molding layer MD1 may include, for example, an epoxy mold compound (EMC). According to some embodiments, a lateral surface of the first molding layer MD1 may be coplanar with that of the second semiconductor chip 150. Two coplanar surfaces may refer to two surfaces that are on the same plane. According to some embodiments, the lateral surface of the first molding layer MD1 may be coplanar with that of the first connection structure 130.

The connection members CP may extend between the first connection structure 130 and the third chip pads BP3. The connection members CP may provide an electrical path between the second semiconductor chip 150 and the first connection structure 130. The connection members CP may include, for example, a metal material including copper (Cu), silver (Ag), gold (Au), tungsten (W), aluminum (Al), titanium (Ti), tantalum (Ta), lead (Pb), tin (Sn), or a combination thereof. Although each of the connection members CP has a column shape in FIG. 1, each of the connection members CP may have an arbitrary shape including a bump shape.

The first bond pads BP1 may be located on the first chip pads 144A of the first semiconductor chip 140. The third bond pads BP3 may be located on the connection members CP. The first bond insulation layer BO1 may at least partially surround the first bond pads BP1 and the third bond pads BP3. The first bond insulation layer BO1 may be located on the first molding layer MD1 and the first semiconductor chip 140. The second bond pads BP2 and the fourth bond pads BP4 may be located on the lower surface of the second semiconductor chip 150. The second bond insulation layer BO2 may at least partially surround the second bond pads BP2 and the fourth bond pads BP4. The first bond pads BP1 may directly contact the second bond pads BP2, and the third bond pads BP3 may directly contact the fourth bond pads BP4. According to some embodiments, the second bond insulation layer BO2 may directly contact the first bond insulation layer BO1.

According to the inventive concept, the second semiconductor chip 150 may be directly connected to the first semiconductor chip 140 due to direct contact between the first bond pads BP1 and the second bond pads BP2 without bumps between the first semiconductor chip 140 and the second semiconductor chip 150. Accordingly, because a polymer layer that surrounds bumps, is between the first semiconductor chip 140 and the second semiconductor chip 150, and has low thermal conductivity is not needed, the semiconductor package 100 may have improved thermal conductivity. Because bumps having relatively large sizes are not needed, the first through fourth bond pads BP1 through BP4 having small sizes and small pitches may be used, and thus the semiconductor package 100 may have improved integration and an increased speed.

The first through fourth bond pads BP1 through BP4 may include a conductive material, for example, a metal material including copper (Cu), silver (Ag), gold (Au), tungsten (W), aluminum (Al), titanium (Ti), tantalum (Ta), or a combination thereof. The first bond insulation layer BO1 and the second bond insulation layer BO2 may include an inorganic insulating material, for example, silicon oxide, silicon nitride, silicon carbonitride, silicon oxynitride, or a combination thereof.

According to some embodiments, as shown in FIG. 2, the first chip pads BP1 may be aligned with the first chip pads 144A of the first semiconductor chip 140. The first bond pads BP1 may be aligned with the second bond pads BP2. However, according to other embodiments, as shown in FIG. 3A, the first chip pads BP1 may be misaligned with the first chip pads 144A of the first semiconductor chip 140. As shown in FIG. 3B, the second bond pads BP2 may be misaligned with the first bond pads BP1. An alignment error between the first bond pads BP1 and the second bond pads BP2 may be within, for example, about 100 nm.

The external connection terminals 110 may be located on the lower surfaces of the terminal pads 120. The external connection terminals 110 may be used to connect the semiconductor package 100 to the outside of the semiconductor package 100. According to some embodiments, the external connection terminals 110 may be solder bumps. The external connection terminals 110 may include, for example, a conductive material including tin (Sn), lead (Pb), copper (Cu), silver (Ag), or a combination thereof.

The terminal pads 120 may be located on the lower surface of the first connection structure 130 and may contact the external connection terminals 110. The terminal pads 120 may be referred to as under bump metals (UBMs). The terminal pads 120 may include a metal material, for example, copper (Cu), nickel (Ni), silver (Ag), chromium (Cr), titanium (Ti), or a palladium (Pd).

Figure 4:
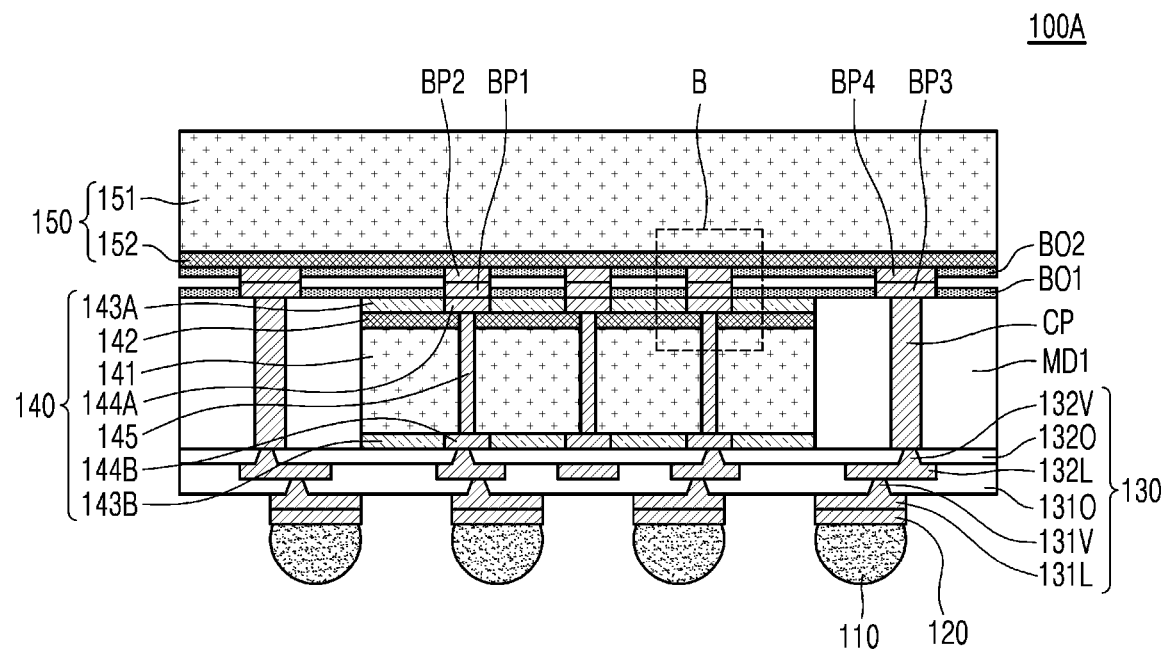
FIG. 4 is a cross-sectional view of a packaged semiconductor device according to an embodiment of the inventive concept.
Figure 5:
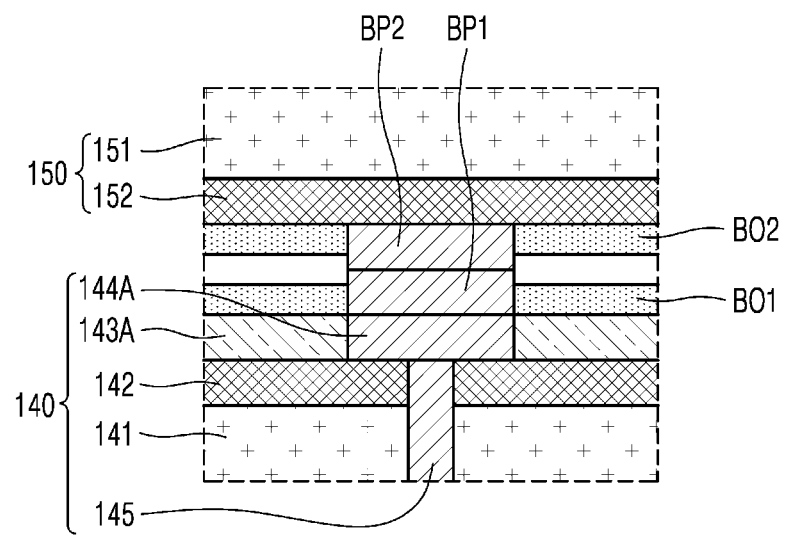
FIG. 5 is a magnified view of region B of FIG. 4.

FIG. 4 is a cross-sectional view of a semiconductor package 100A according to an embodiment of the inventive concept. FIG. 5 is a magnified view of a region B of FIG. 4. A difference between the semiconductor package 100 of FIG. 1 and the semiconductor package 100A of FIGS. 4 and 5 will now be described. Referring to FIGS. 4 and 5, the first bond insulation layer BO1 may not contact the second bond insulation layer BO2. In other words, the first bond insulation layer BO1 may be apart from the second bond insulation layer BO2. For example, the first bond pads BP1 may protrude upwards from the upper surface of the first bond insulation layer BO1, and the second bond pads BP2 may protrude downwards from the lower surface of the second bond insulation layer BO2. Accordingly, even when the first bond pads BP1 contact the second bond pads BP2, the first bond insulation layer BO1 may be apart from the second bond insulation layer BO2. According to some embodiments, a portion of the first bond insulation layer BO1 and a portion of the second bond insulation layer BO2 may contact each other, and a remaining portion of the first bond insulation layer BO1 and a remaining portion of the second bond insulation layer BO2 may be apart from each other.

Figure 6:
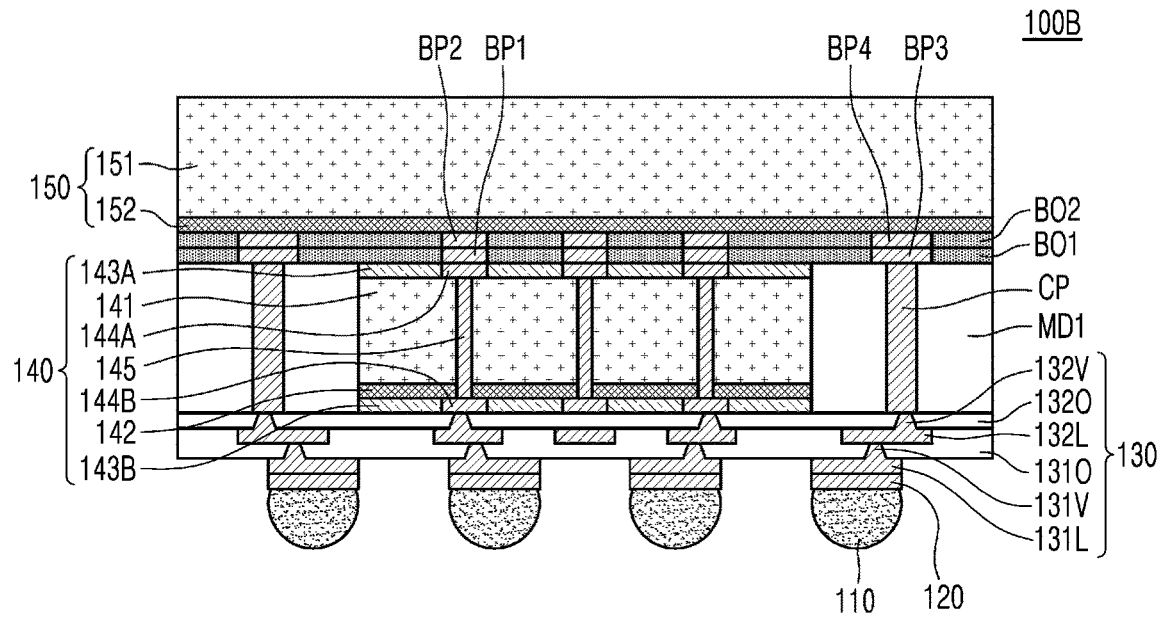
FIG. 6 is a cross-sectional view of a packaged semiconductor device according to an embodiment of the inventive concept.

FIG. 6 is a cross-sectional view of a semiconductor package 100B according to an embodiment of the inventive concept. A difference between the semiconductor package 100 of FIG. 1 and the semiconductor package 100B of FIG. 6 will now be described. Referring to FIG. 6, in the first semiconductor chip 140, the semiconductor device 142 may be located on the lower surface of the substrate 141. In other words, the active surface of the substrate 141 may be the lower surface of the substrate 141, and the non-active surface of the substrate 141 may be the upper surface of the substrate 141.

Figure 7:
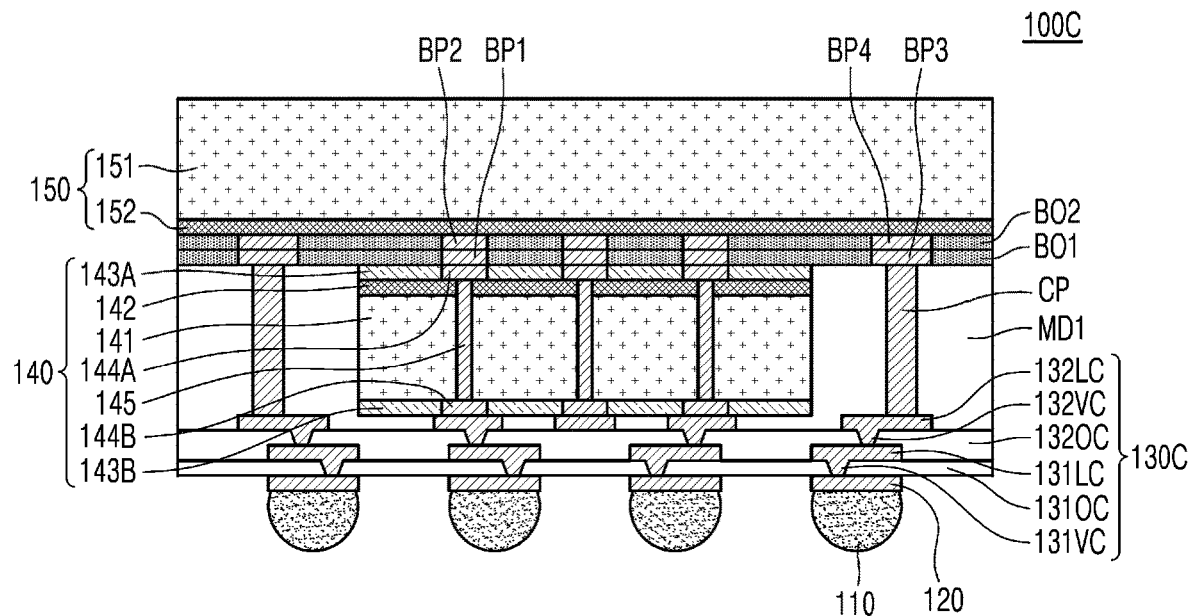
FIG. 7 is a cross-sectional view of a packaged semiconductor device according to an embodiment of the inventive concept.

FIG. 7 is a cross-sectional view of a semiconductor package 100C according to an embodiment of the inventive concept. A difference between the semiconductor package 100 of FIG. 1 and the semiconductor package 100C of FIG. 7 will now be described. Referring to FIG. 7, the semiconductor package 100C may include a first connection structure 130C instead of the first connection structure 130 of FIG. 1. The first connection structure 130C may be an RDL first structure. In other words, after the first connection structure 130C is formed, the first semiconductor chip 140 may be arranged on the first connection structure 130C. The first connection structure 130C may include, for example, a first insulation layer 132OC on the lower surface of the first molding layer MD1, first conductive patterns 132LC between the first insulation layer 132OC and the first molding layer MD1, first conductive vias 132VC penetrating through the first insulation layer 132OC and contacting the first conductive patterns 132LC, a second insulation layer 131OC on the lower surface of the first insulation layer 132OC, second conductive patterns 131LC located between the second insulation layer 131OC and the first insulation layer 132OC and contacting the first conductive vias 132VC, and second conductive vias 131VC penetrating through the second insulation layer 131OC and contacting the second conductive patterns 131LC. According to some embodiments, the first conductive patterns 132LC and the first conductive vias 132VC may be integrally formed with each other. According to some embodiments, the second conductive patterns 131LC and the second conductive vias 131VC may be integrally formed with each other. According to some embodiments, the terminal pads 120 may contact the second conductive vias 131VC. The connection members CP may contact the first conductive patterns 132LC, and the second chip pads 144B of the first semiconductor chip 140 may contact other first conductive patterns 132LC. Although the first connection structure 130C includes the first and second conductive patterns 132LC and 131LC corresponding to two layers and the two first and second insulation layers 131OC and 132OC in FIG. 7, the first connection structure 130C may include more conductive pattern layers and more insulation layers.

Figure 8:
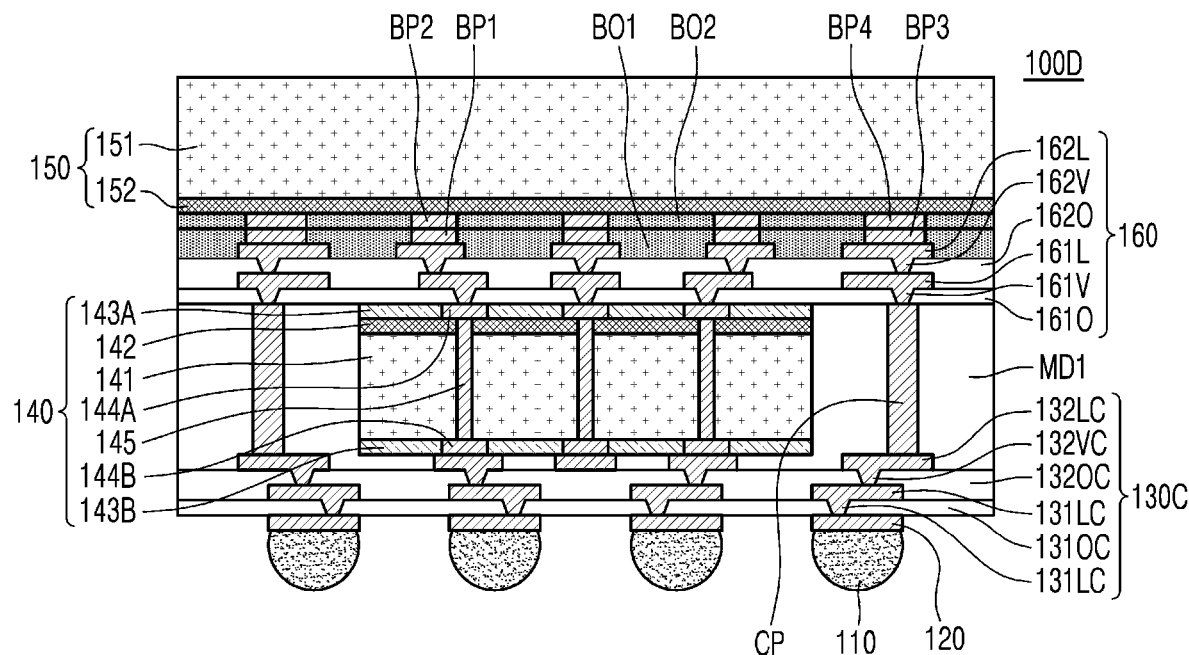
FIG. 8 is a cross-sectional view of a packaged semiconductor device according to an embodiment of the inventive concept.

FIG. 8 is a cross-sectional view of a semiconductor package 100D according to an embodiment of the inventive concept. A difference between the semiconductor package 100C of FIG. 7 and the semiconductor package 100D of FIG. 8 will now be described. Referring to FIG. 8, the semiconductor package 100D may further include a second connection structure 160. The second connection structure 160 may be between the first molding layer MD1 and the first bond insulation layer BO1 and between the first semiconductor chip 140 and the first bond insulation layer BO1. The second connection structure 160 may connect the first semiconductor chip 140 to the first bond pads BP1. The second connection structure 160 may connect the connection members CP to the third bond pads BP3. In other words, the second semiconductor chip 150 may be connected to the first semiconductor chip 140 and the connection members CP via the second connection structure 160. The second connection structure 160 may be a redistribution structure. In FIG. 8, the second connection structure 160 has an RDL last structure (after the first semiconductor chip 140 is arranged, the second connection structure 160 is formed on the first semiconductor chip 140). However, according to another embodiment, the second connection structure 160 may have an RDL first structure (after the second connection structure 160 is formed, the first semiconductor chip 140 is arranged on the second connection structure 160).

The second connection structure 160 may include, for example, a first insulation layer 161O on the first molding layer MD1, the first semiconductor chip 140, and the connection members CP, first conductive vias 161V penetrating through the first insulation layer 161O, first conductive patterns 161L located on the first insulation layer 161O and contacting the first conductive vias 161V, a second insulation layer 162O on the first insulation layer 161O and the first conductive patterns 161L, second conductive vias 162V contacting the first conductive patterns 161L by penetrating through the second insulation layer 162O, and second conductive patterns 162L located on the second insulation layer 162O and contacting the second conductive vias 162V. Although the second connection structure 160 includes the first and second conductive patterns 161L and 162L corresponding to two layers and the two first and second insulation layers 161O and 162O in FIG. 8, the second connection structure 160 may include more conductive pattern layers and more insulation layers. According to some embodiments, the first conductive vias 161V and the first conductive patterns 161L may be integrally formed with each other. According to some embodiments, the second conductive vias 162V and the second conductive patterns 162L may be integrally formed with each other. According to some embodiments, the first chip pads 144A of the first semiconductor chip 140 may contact some first conductive vias 161V, and the connection members CP may contact other first conductive vias 161V. According to some embodiments, the first bond pads BP1 may contact some second conductive patterns 162L, and the third bond pads BP3 may contact other second conductive patterns 162L. The first conductive vias 161V, the first conductive patterns 161L, the second conductive vias 162V, and the second conductive patterns 162L may form electrical paths.

According to some embodiments, the first insulation layer 161O and the second insulation layer 162O may include an insulating material, for example, silicon oxide, silicon nitride, or a combination thereof. The first conductive vias 161V, the first conductive patterns 161L, the second conductive vias 162V, and the second conductive patterns 162L may include a conductive material, for example, a metal material including copper (Cu), silver (Ag), gold (Au), tungsten (W), aluminum (Al), titanium (Ti), tantalum (Ta), or a combination thereof.

Figure 9:
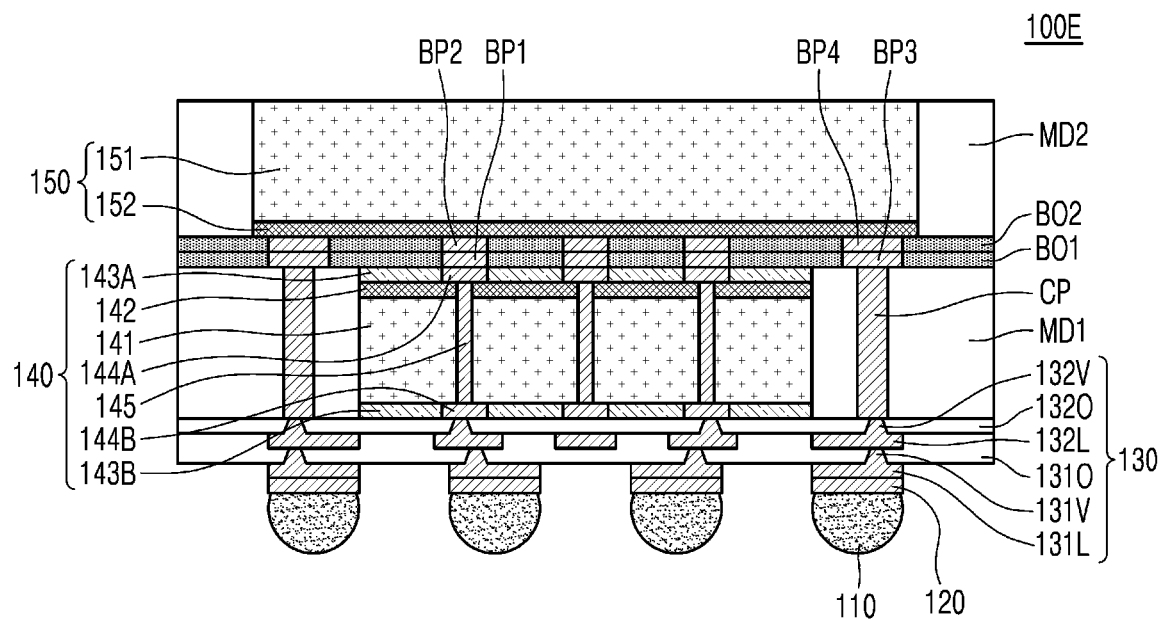
FIG. 9 is a cross-sectional view of a packaged semiconductor device according to an embodiment of the inventive concept.

FIG. 9 is a cross-sectional view of a semiconductor package 100E according to an embodiment of the inventive concept. A difference between the semiconductor package 100 of FIG. 1 and the semiconductor package 100E of FIG. 9 will now be described. Referring to FIG. 9, the semiconductor package 100E may further include a second molding layer MD2 that at least partially surrounds the second semiconductor chip 150. The second molding layer MD2 may be located on the second bond insulation layer BO2. The lateral surface of the second molding layer MD2 may be coplanar with the lateral surface of the first molding layer MD1. The second molding layer MD2 may support a temperature of about 300° C. or greater, may have a thermal expansion coefficient of about 0 to 10 ppm/° C., and may include a material that has good adhesion with the second bond insulation layer BO2. The second molding layer MD2 may include, for example, epoxy resin, silicone resin, or a combination thereof. The second molding layer MD2 may include, for example, an EMC. According to some embodiments, the second molding layer MD2 may include the same material as the first molding layer MD1

Figure 10:
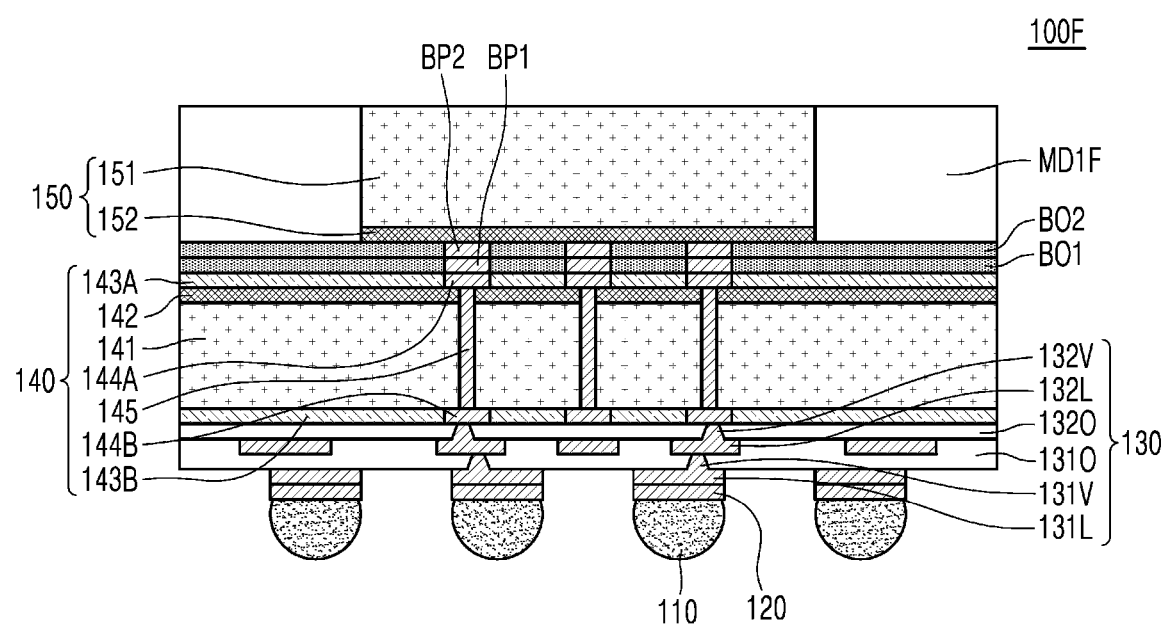
FIG. 10 is a cross-sectional view of a packaged semiconductor device according to an embodiment of the inventive concept.

FIG. 10 is a cross-sectional view of a semiconductor package 100F according to an embodiment of the inventive concept. A difference between the semiconductor package 100 of FIG. 1 and the semiconductor package 100F of FIG. 10 will now be described. Referring to FIG. 10, the semiconductor package 100F may include a first molding layer MD1F instead of the first molding layer MD1 of FIG. 1. The first molding layer MD1F may not surround the first semiconductor chip 140 but may surround the second semiconductor chip 150. The second bond insulation layer BO2 may be located on the second semiconductor chip 150 and the first molding layer MD1F. According to some embodiments, the lateral surface of the first semiconductor chip 140 may be coplanar with the lateral surface of the first molding layer MD1F. According to some embodiments, the lateral surface of the first semiconductor chip 140 may be coplanar with the lateral surface of the first connection structure 130.

Figure 11:
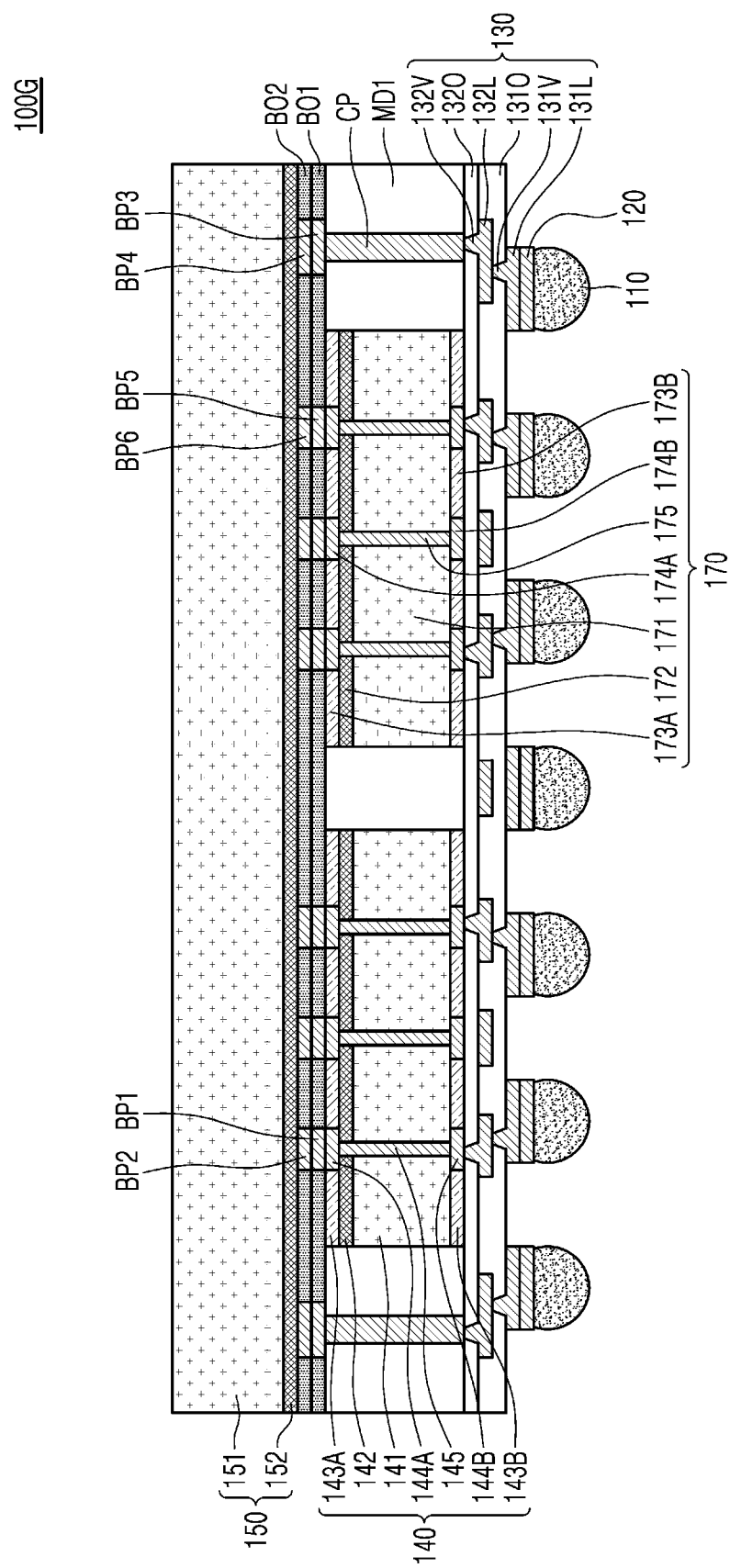
FIG. 11 is a cross-sectional view of a packaged semiconductor device according to an embodiment of the inventive concept.

FIG. 11 is a cross-sectional view of a semiconductor package 100G according to an embodiment of the inventive concept. A difference between the semiconductor package 100 of FIG. 1 and the semiconductor package 100G of FIG. 11 will now be described. Referring to FIG. 11, the semiconductor package 100G may further include a third semiconductor chip 170 between the first connection structure 130 and the first bond insulation layer BO1. The third semiconductor chip 170 may be at least partially surrounded by the first molding layer MD1. The third semiconductor chip 170 may be arranged beside the first semiconductor chip 140. The third semiconductor chip 170 may include a substrate 171, a semiconductor device 172 on the substrate 171, first chip pads 174A on the upper surface of the substrate 171, second chip pads 174B on the lower surface of the substrate 171, TSVs 175 each extending between the first chip pads 174A and the second chip pads 174B by penetrating through the substrate 171, a first chip insulation layer 173A located on the upper surface of the substrate 171 and at least partially surrounding the first chip pads 174A, and a second chip insulation layer 173B located on the lower surface of the substrate 171 and at least partially surrounding the second chip pads 174B.

Descriptions of the substrate 171, the semiconductor device 172, the first chip pads 174A, the second chip pads 174B, the TSVs 175, the first chip insulation layer 173A, and the second chip insulation layer 173B of the third semiconductor chip 170 are the same as those of the substrate 141, the semiconductor device 142, the first chip pads 144A, the second chip pads 144B, the TSVs 145, the first chip insulation layer 143A, and the second chip insulation layer 143B of the first semiconductor chip 140 of FIG. 1, and thus will be omitted herein.

The semiconductor package 100G may further include fifth bond pads BP5 and sixth bond pads BP6. The fifth bond pads BP5 may be located on the first chip pads 174A of the third semiconductor chip 170 and may be at least partially surrounded by the first bond insulation layer BO1. The sixth bond pads BP6 may be located on the lower surface of the second semiconductor chip 150 and may be at least partially surrounded by the second bond insulation layer BO2. The sixth bond pads BP6 may directly contact the fifth bond pads BP5. The fifth and sixth bond pads BP5 and BP6 may include a conductive material, for example, a metal material including copper (Cu), silver (Ag), gold (Au), tungsten (W), aluminum (Al), titanium (Ti), tantalum (Ta), or a combination thereof.

Figure 12:
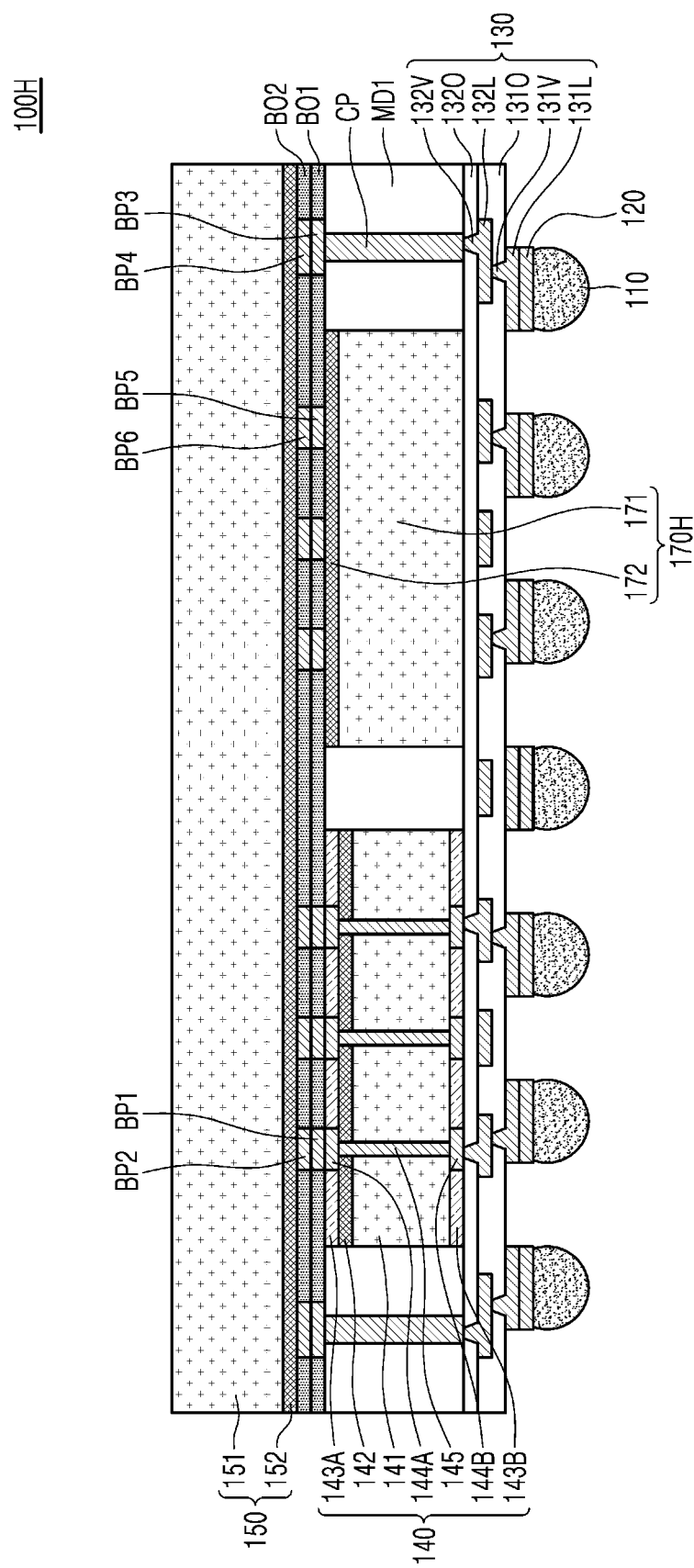
FIG. 12 is a cross-sectional view of a packaged semiconductor device according to an embodiment of the inventive concept.

FIG. 12 is a cross-sectional view of a semiconductor package 100H according to an embodiment of the inventive concept. A difference between the semiconductor package 100H of FIG. 12 and the semiconductor package 100G of FIG. 11 will now be described. Referring to FIG. 12, the semiconductor package 100H may include a third semiconductor chip 170H instead of the third semiconductor chip 170 of FIG. 11. The third semiconductor chip 170H may not include the TSVs 175, the first chip pads 174A, the second chip pads 174B, the first chip insulation layer 173A, and the second chip insulation layer 173B of FIG. 11. The third semiconductor chip 170H may not be directly connected to the first connection structure 130. For example, the third semiconductor chip 170H may not be connected to the first connection structure 130 or may be connected to the first connection structure 130 via the second semiconductor chip 150.

Figure 13:
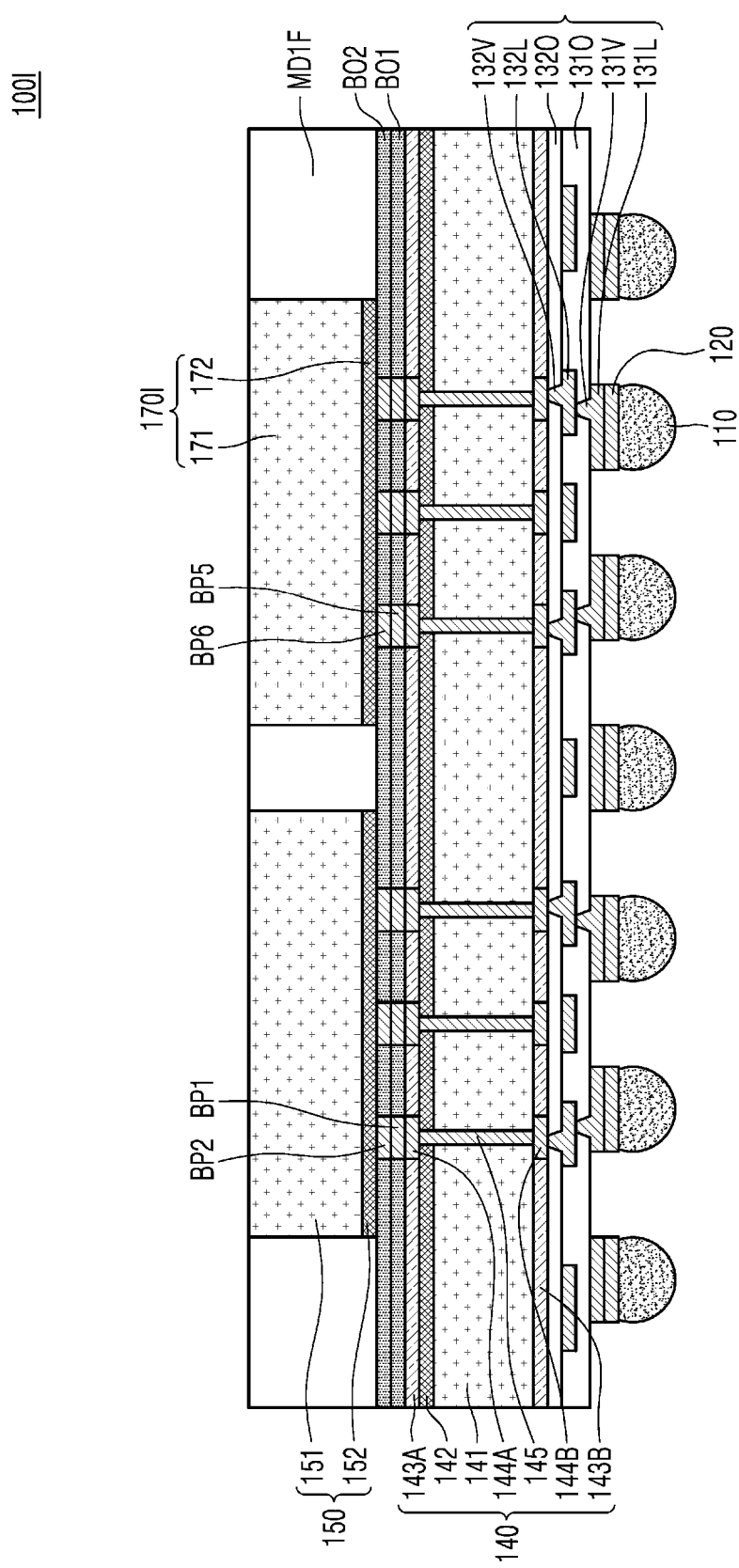
FIG. 13 is a cross-sectional view of a packaged semiconductor device according to an embodiment of the inventive concept.

FIG. 13 is a cross-sectional view of a semiconductor package 100I according to an embodiment of the inventive concept. A difference between the semiconductor package 100F of FIG. 10 and the semiconductor package 100I of FIG. 13 will now be described. Referring to FIG. 13, the semiconductor package 100I may further include a third semiconductor chip 170I on the second bond insulation layer BO2. The third semiconductor chip 170I may be at least partially surrounded by the first molding layer MD1F. The third semiconductor chip 170I may be arranged beside the second semiconductor chip 150. The third semiconductor chip 170I may include a substrate 171 and a semiconductor device 172 on the lower surface of the substrate 171.

The semiconductor package 100I may further include fifth bond pads BP5 and sixth bond pads BP6. The fifth bond pads BP5 may be located on the first chip pads 144A of the first semiconductor chip 140 and may be at least partially surrounded by the first bond insulation layer BO1. The sixth bond pads BP6 may be located on the lower surface of the third semiconductor chip 170I and may be at least partially surrounded by the second bond insulation layer BO2. The sixth bond pads BP6 may directly contact the fifth bond pads BP5. The fifth and sixth bond pads BP5 and BP6 may include a conductive material, for example, a metal material including copper (Cu), silver (Ag), gold (Au), tungsten (W), aluminum (Al), titanium (Ti), tantalum (Ta), or a combination thereof.

Figure 14:
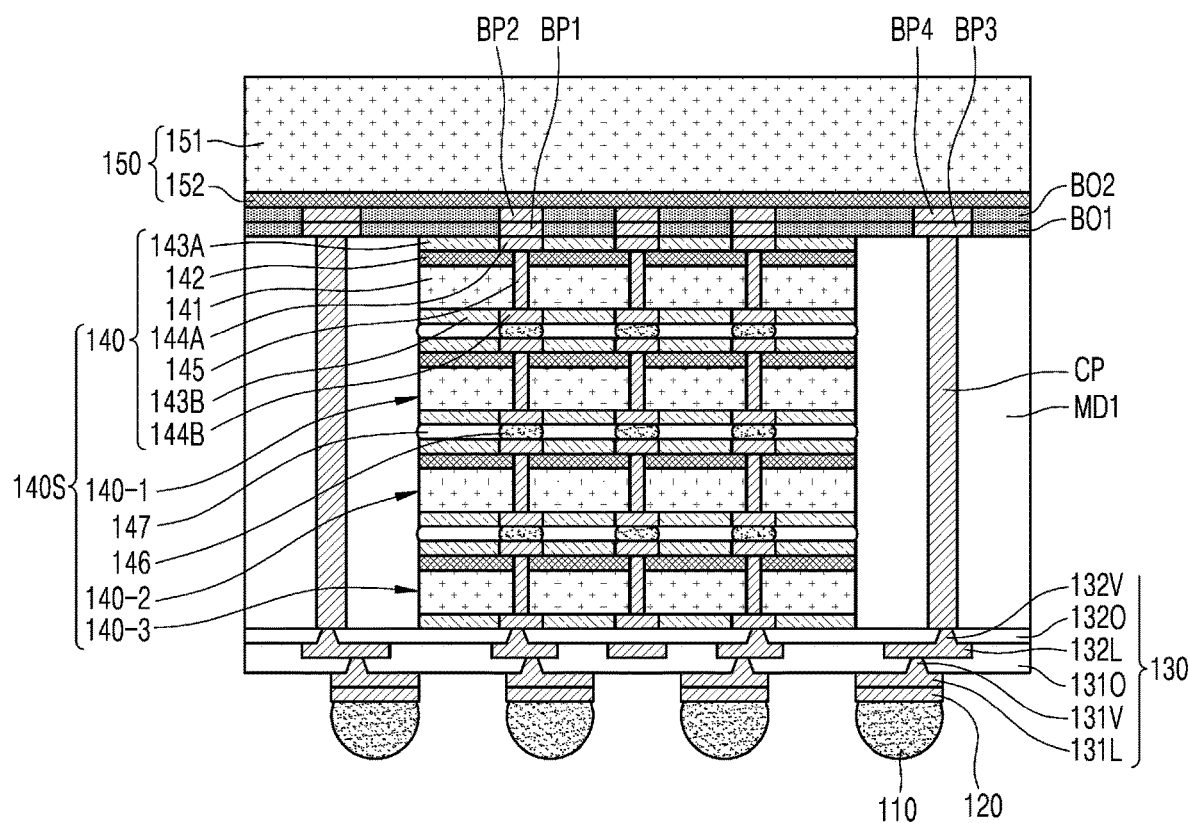
FIG. 14 is a cross-sectional view of a packaged semiconductor device according to an embodiment of the inventive concept.

FIG. 14 is a cross-sectional view of a semiconductor package 100J according to an embodiment of the inventive concept. A difference between the semiconductor package 100 of FIG. 1 and the semiconductor package 100J of FIG. 14 will now be described. Referring to FIG. 14, the semiconductor package 100J may include a semiconductor chip stack 140S including the first semiconductor chip 140. The semiconductor chip stack 140S may include a plurality of semiconductor chips, namely, the first semiconductor chip 140 and additional semiconductor chips 140-1 through 140-3, stacked on the first connection structure 130 in a vertical direction. In other words, the semiconductor package 100J may further include the additional semiconductor chips 140-1 through 140-3 stacked between the first semiconductor chip 140 and the first connection structure 130. Although the semiconductor chip stack 140S includes the four semiconductor chips 140 and 140-1 through 140-3 in FIG. 14, the semiconductor chip stack 140S may include more or fewer semiconductor chips than four semiconductor chips. Each of the additional semiconductor chips 140-1 through 140-3 may include the substrate 141, the semiconductor device 142 on the substrate 141, the first chip pads 144A on the upper surface of the substrate 141, the second chip pads 144B on the lower surface of the substrate 141, the TSVs 145 extending between the first chip pads 144A and the second chip pads 144B by penetrating through the substrate 141, the first chip insulation layer 143A located on the upper surface of the substrate 141 and at least partially surrounding the first chip pads 144A, and the second chip insulation layer 143B located on the lower surface of the substrate 141 and at least partially surrounding the second chip pads 144B.

The semiconductor chip stack 140S may further include an inter-chip connection member 146 that connects two adjacent semiconductor chips (for example, the semiconductor chips 140 and 140-1) and is between the two adjacent semiconductor chips. In other words, the first chip pads 144A of a lower semiconductor chip (for example, 140-1) from among the two adjacent semiconductor chips (for example, 140 and 140-1) and the second chip pads 144B of an upper semiconductor chip (for example, 140) from among the two adjacent semiconductor chips (for example, 140 and 140-1) may be connected to each other via the inter-chip connection member 146. The inter-chip connection member 146 may include a conductive material including tin (Sn), lead (Pb), copper (Cu), silver (Ag), or a combination thereof. The semiconductor chip stack 140S may further include a chip adhesion layer 147 between the semiconductor chips 140 and 140-1 through 140-3 of the semiconductor chip stack 140S and surrounding the inter-chip connection member 146. The chip adhesion layer 147 may include, for example, epoxy resin, urethane resin, acrylic resin, or a combination thereof. The semiconductor chip stack 140S may be at least partially surrounded by the first molding layer MD1.

Figure 15:
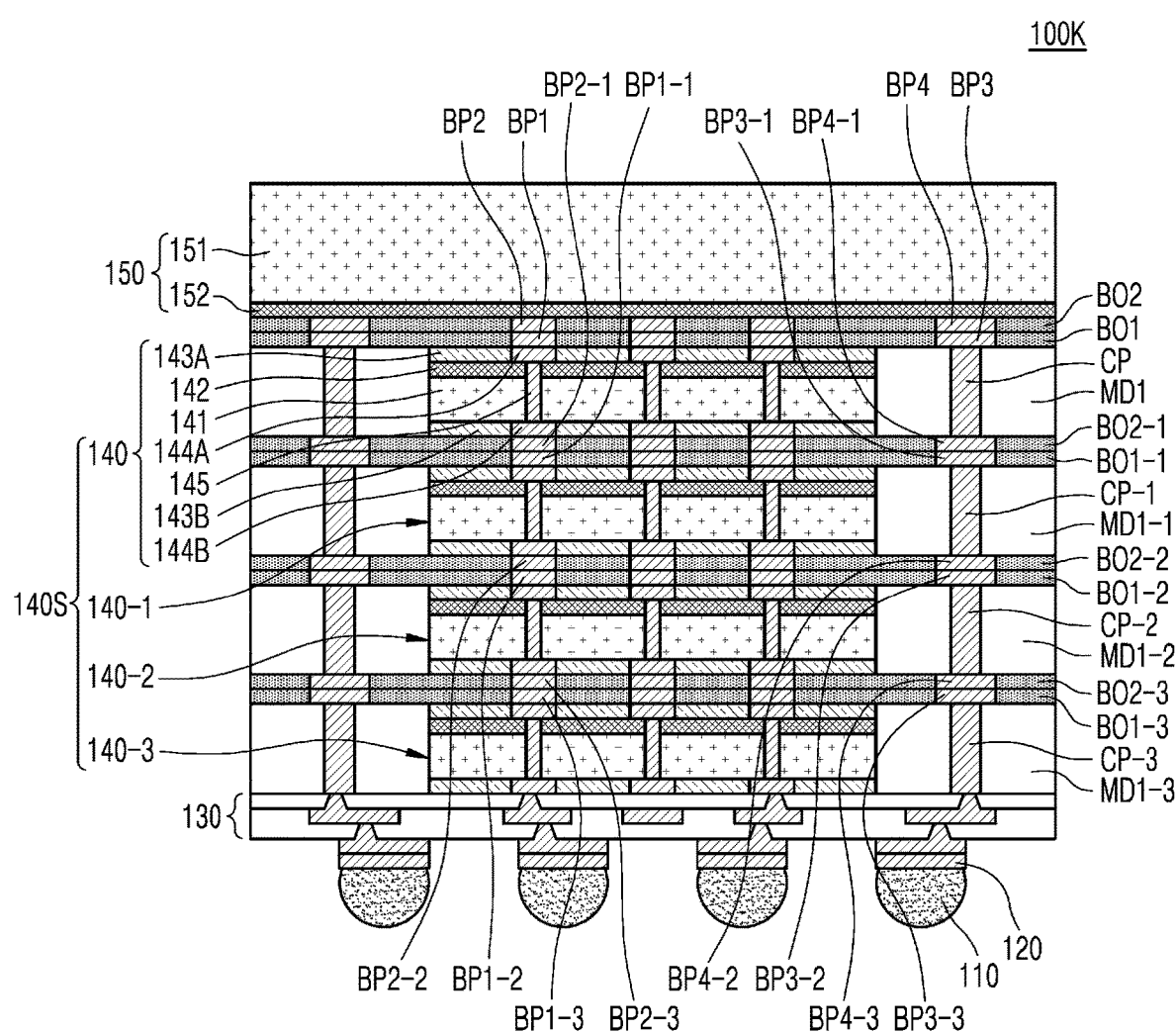
FIG. 15 is a cross-sectional view of a packaged semiconductor device according to an embodiment of the inventive concept.

FIG. 15 is a cross-sectional view of a semiconductor package 100K according to an embodiment of the inventive concept. A difference between the semiconductor package 100J of FIG. 14 and the semiconductor package 100K of FIG. 15 will now be described. Referring to FIG. 15, adjacent two semiconductor chips (for example, 140 and 140-1) within the semiconductor chip stack 140S may be connected to each other by inter-chip bond pads (namely, first and second additional bond pads BP1-1 and BP2-1) instead of the inter-chip connection member 146 of FIG. 14. The additional semiconductor chips 140-1 through 140-3 may be surrounded by additional molding layers MD1-1 through MD1-3, respectively. First additional bond pads BP1-1 through BP1-3 may be located on the first chip pads 144A of the additional semiconductor chips 140-1 through 140-3, respectively. First additional bond insulation layers BO1-1 through BO1-3 may be located on the additional semiconductor chips 140-1 through 140-3, respectively, and the additional molding layers MD1-1 through MD1-3 surrounding the additional semiconductor chips 140-1 through 140-3, respectively, and may surround the first additional bond pads BP1-1 through BP1-3, respectively. Second additional bond pads BP2-1 through BP2-3 may be located on the second chip pads 144B of the semiconductor chips (for example, 140, 140-1, and 140-2), respectively. Second additional bond insulation layers BO2-1 through BO2-3 may be located on the semiconductor chips 140, 140-1, and 140-2, respectively, and the first molding layers MD1, MD1-1, and MD1-2 surrounding the semiconductor chips 140, 140-1, and 140-2, respectively, and may surround the second additional bond pads BP2-1 through BP2-3, respectively. The first additional bond pads BP1-1 through BP1-3 and the second additional bond pads BP2-1 through BP2-3 may directly contact each other, respectively.

Two adjacent connection members (for example, CP and CP-1) may be connected to each other by additional bond pads (namely, third and fourth additional bond pads BP3-1 and BP4-1) extending therebetween. Third additional bond pads BP3-1 through BP3-3 may be located on respective upper surfaces of connection members CP-1 through CP-3, respectively. The first additional bond insulation layers BO1-1 through BO1-3 may surround the third additional bond pads BP3-1 through BP3-3, respectively. Fourth additional bond pads BP4-1 through BP4-3 may be located on respective lower surfaces of the connection members CP, CP-1, and CP-2, respectively. The second additional bond insulation layers BO2-1 through BO2-3 may surround the fourth additional bond pads BP4-1 through BP4-3. The third additional bond pads BP3-1 through BP3-3 may directly contact the fourth additional bond pads BP4-1 through BP4-3.

The first additional bond pads BP1-1 through BP1-3, the second additional bond pads BP2-1 through BP2-3, the third additional bond pads BP3-1 through BP3-3, and the fourth additional bond pads BP4-1 through BP4-4 may include a conductive material, for example, a metal material including copper (Cu), silver (Ag), gold (Au), tungsten (W), aluminum (Al), titanium (Ti), tantalum (Ta), or a combination thereof. The first additional bond insulation layers BO1-1 through BO1-3 and the second additional bond insulation layers BO2-1 through BO2-3 may include an inorganic insulating material, for example, silicon oxide, silicon nitride, silicon carbonitride, or a combination thereof.

Figure 16:
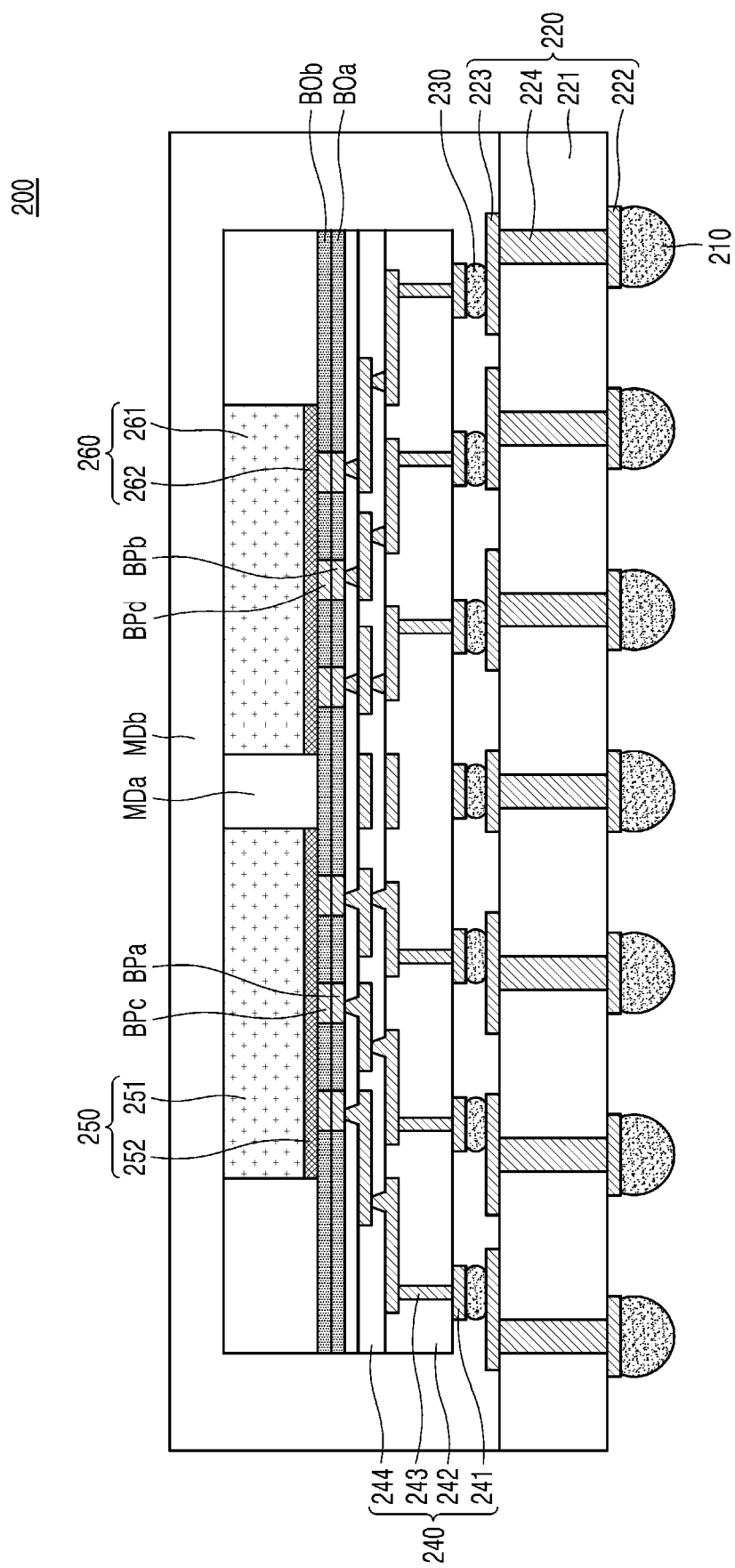
FIG. 16 is a cross-sectional view of a packaged semiconductor device according to an embodiment of the inventive concept.

FIG. 16 is a cross-sectional view of a semiconductor package 200 according to an embodiment of the inventive concept. Referring to FIG. 16, the semiconductor package 200 may include a package substrate 220, an interposer 240 on the package substrate 220, first bond pads BPa on the interposer 240, second bond pads BPb on the interposer 240, a first bond insulation layer BOa located on the interposer 240 and surrounding the first bond pads BPa and the second bond pads BPb, third bond pads BPc directly contacting the first bond pads BPa, fourth bond pads BPd directly contacting the second bond pads BPb, a second bond insulation layer BOb surrounding the third bond pads BPc and the fourth bond pads BPd, a first semiconductor chip 250 on the second bond insulation layer BOb and the third bond pad BPc, a second semiconductor chip 260 on the second bond insulation layer BOb and the fourth bond pad BPd, and a first molding layer MDa located on the second bond insulation layer BOb and surrounding the first semiconductor chip 250 and the second semiconductor chip 260. According to some embodiments, the semiconductor package 200 may further include external connection terminals 210 on the lower surface of the package substrate 220. According to some embodiments, the semiconductor package 200 may further include internal connection members 230 between the interposer 240 and the package substrate 220. According to some embodiments, the semiconductor package 200 may further include a second molding layer MDb that is located on the package substrate 220 and surrounds the interposer 240 and the first molding layer MDa.

The package substrate 220 may be, for example, a printed circuit board (PCB). The package substrate 220 may include, for example, a body 221, lower conductive patterns 222 on the lower surface of the body 221, upper conductive patterns 223 on the upper surface of the body 221, and through vias 224 connecting the lower conductive patterns 222 to the upper conductive patterns 223 by penetrating through the body 221. The body 221 may include phenol resin, epoxy resin, polyimide resin, or a combination thereof. For example, the body 221 may include flame retardant 4 (FR4), tetrafunctional epoxy, polyphenylene ether, epoxy/polyphenylene oxide, bismaleimide triazine (BT), thermount, cyanate ester, polyimide, or liquid crystal polymer. The lower conductive patterns 222, the upper conductive patterns 223, and the through vias 224 may include a conductive material, for example, a metal material including copper (Cu), silver (Ag), gold (Au), tungsten (W), aluminum (Al), titanium (Ti), tantalum (Ta), or a combination thereof.

The external connection terminals 210 may be located on the lower conductive patterns 222 of the package substrate 220. The external connection terminals 210 may include, for example, a conductive material including tin (Sn), lead (Pb), copper (Cu), silver (Ag), or a combination thereof.

The interposer 240 may connect the first semiconductor chip 250 to the second semiconductor chip 260 to the package substrate 220. The interposer 240 may include, for example, a substrate 242, through vias 243 penetrating through the substrate 242, lower pads 241 located on the lower surface of the substrate 242 and connected to the through vias 243, and a redistribution structure 244 located on the upper surface of the substrate 242 and connected to the through vias 243. According to some embodiments, the redistribution structure 244 may be located on the lower surface of the substrate 242 or may be located on both the upper and lower surfaces of the substrate 242. The substrate 242 may include a semiconductor material, a ceramic material, or an organic material. The lower pads 241 and the through vias 243 may include a conductive material, for example, a metal material including copper (Cu), silver (Ag), gold (Au), tungsten (W), aluminum (Al), titanium (Ti), tantalum (Ta), or a combination thereof. A detailed description of the redistribution structure 244 is the same as that of the first connection structure 130 of FIG. 1, and thus will be omitted herein. According to some embodiments, the lateral surface of the interposer 240 may be coplanar with the lateral surface of the first molding layer MD1.

The internal connection members 230 may connect the interposer 240 to the package substrate 220. The internal connection members 230 may be between the lower pads 241 of the interposer 240 and the upper conductive patterns 223 of the package substrate 220. The internal connection members 230 may include, for example, a conductive material including tin (Sn), lead (Pb), copper (Cu), silver (Ag), or a combination thereof.

The first semiconductor chip 250 may include a substrate 251 and a semiconductor device 252 on the lower surface of the substrate 251. The second semiconductor chip 260 may include a substrate 261 and a semiconductor device 262 on the lower surface of the substrate 261. Descriptions of the substrates 251 and 261 of the first semiconductor chip 250 and the second semiconductor chip 260 are the same as those of the substrates 141 and 151 of the first semiconductor chip 140 and the second semiconductor chip 150 of FIG. 1, and thus will be omitted herein. Descriptions of the semiconductor devices 252 and 262 of the first semiconductor chip 250 and the second semiconductor chip 260 are the same as those of the substrates 142 and 152 of the first semiconductor chip 140 and the second semiconductor chip 150 of FIG. 1, and thus will be omitted herein.

According to the inventive concept, the first semiconductor chip 250 and the second semiconductor chip 260 may be directly connected to the interposer 240 due to direct contact between the first bond pads BPa and the third bond pads BPc and between the second bond pads BPb and the fourth bond pads BPd without bumps between the first semiconductor chip 250 and the interposer 240 and between the second semiconductor chip 260 and the interposer 240. Accordingly, because a polymer layer that surrounds bumps, is between the first semiconductor chip 250 and the interposer 240 and between the second semiconductor chip 260 and the interposer 240, and has low thermal conductivity is not needed, the semiconductor package 200 may have improved thermal conductivity. Because bumps having relatively large sizes are not needed, bond pads BPa through BPd having small sizes and small pitches may be used, and thus, the semiconductor package 200 may have improved integration and an increased speed.

Figure 17A:
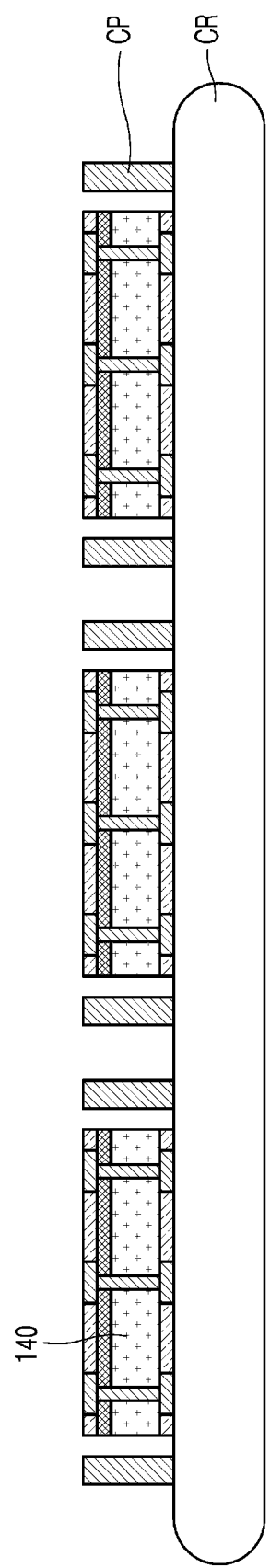
FIGS. 17A through 17H are cross-sectional views illustrating a method of fabricating a packaged semiconductor device, according to an embodiment of the inventive concept.
Figure 17B:
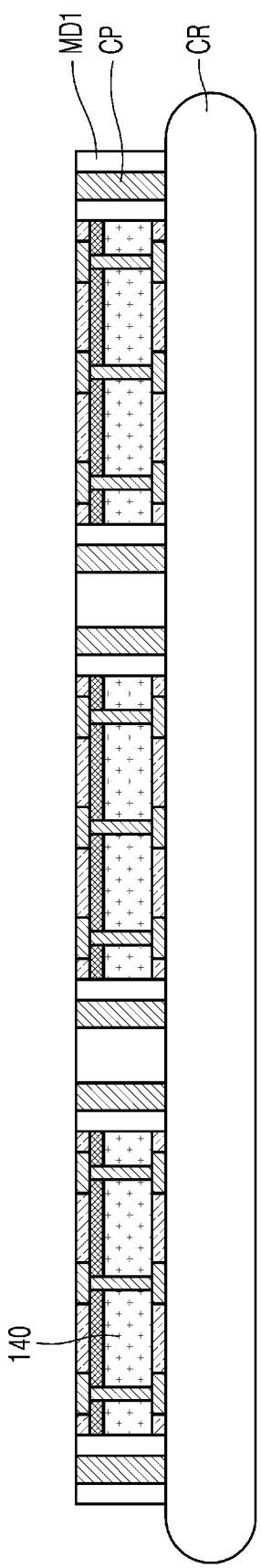
Figure 17C:
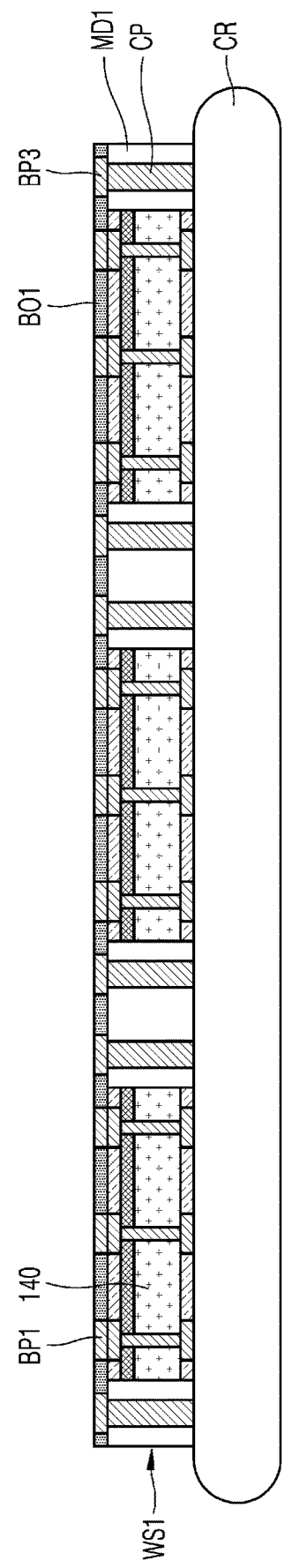
Figure 17D:
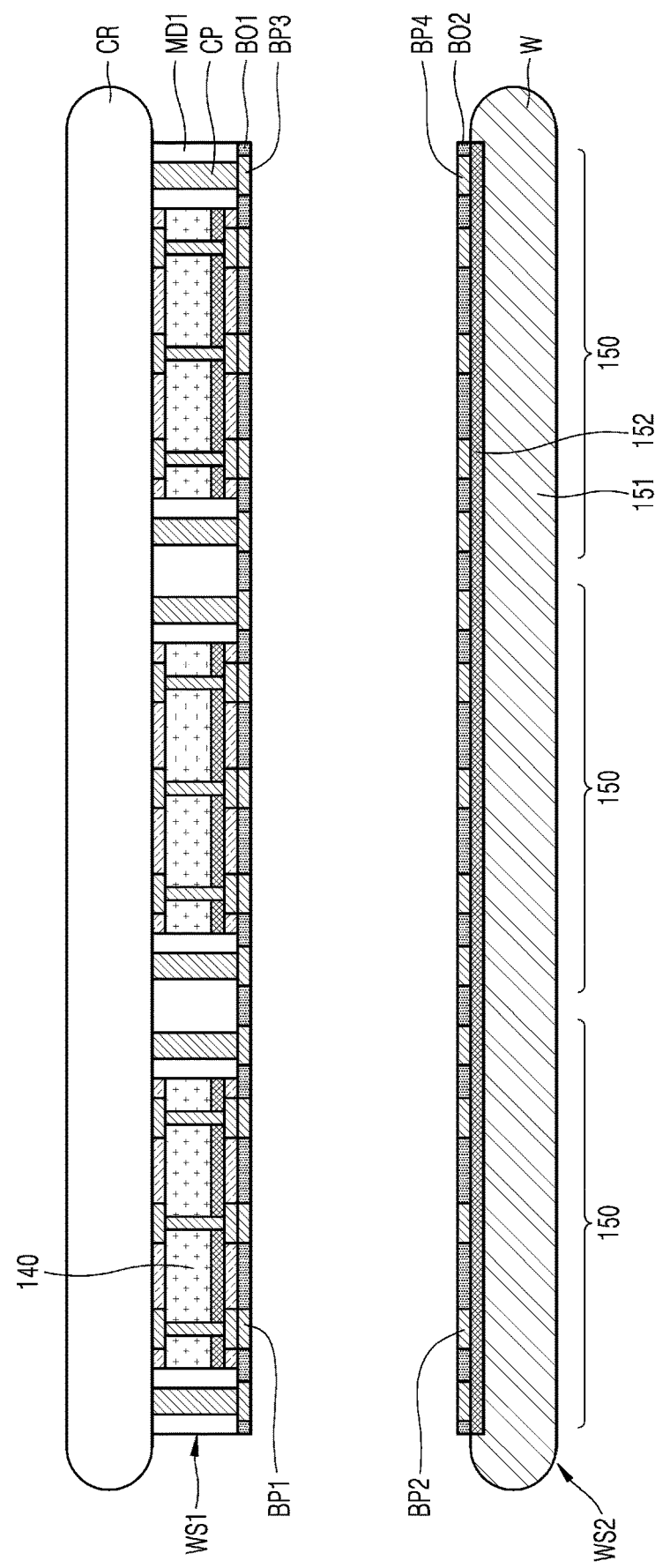
Figure 17E:
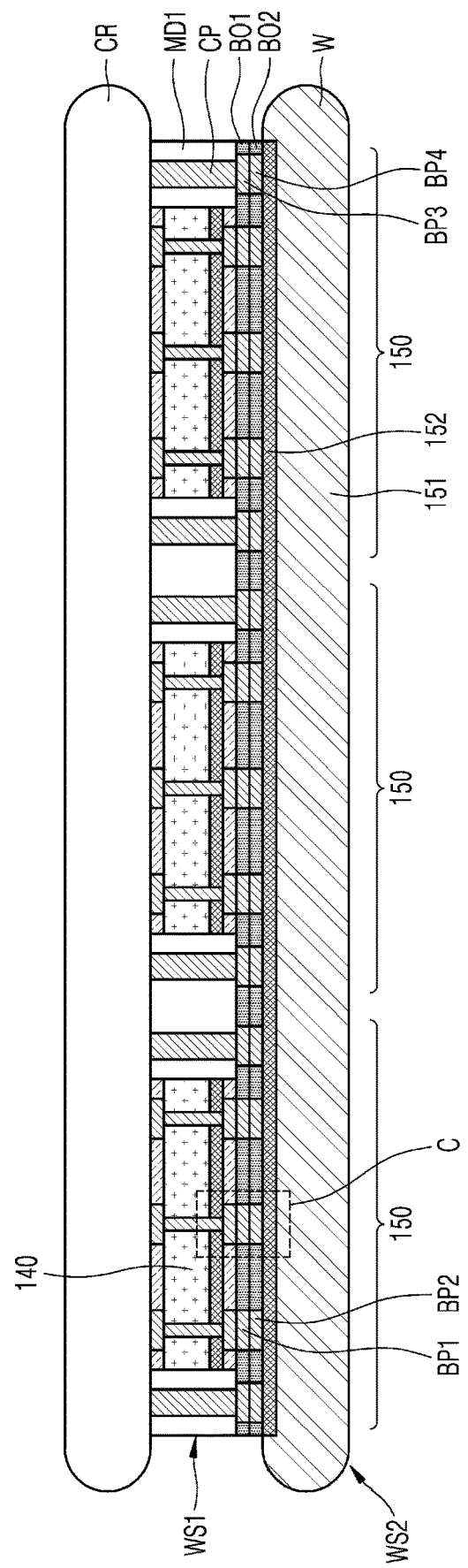
Figure 17F:
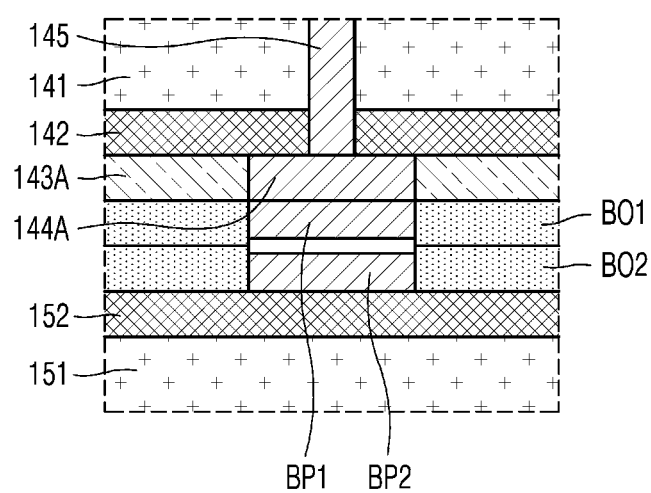

FIGS. 17A through 17H are cross-sectional views illustrating a method of fabricating a semiconductor package, according to an embodiment of the inventive concept. FIG. 17F is a magnified view of a region C of FIG. 17E. Referring to FIG. 17A, a plurality of first semiconductor chips 140 may be arranged on a carrier CR. According to some embodiments, a plurality of connection members CP may be further arranged on the carrier CR.

Referring to FIG. 17B, a first molding layer MD1 surrounding a plurality of first semiconductor chips 140 and a plurality of connection members CP may be formed on the carrier CR. For example, the first molding layer MD1 may be formed on the carrier CR, the plurality of first semiconductor chips 140, and the plurality of connection members CP. Next, the first molding layer MD1 may be planarized such that respective upper surfaces of the plurality of first semiconductor chips 140 and respective upper surfaces of the plurality of connection members CP are exposed. According to some embodiments, after the first molding layer MD1 surrounding the plurality of first semiconductor chips 140 is formed on the carrier CR, the plurality of connection members CP penetrating through the first molding layer MD1 may be arranged on the carrier CR.

Referring to FIG. 17C, a plurality of first bond pads BP1 may be formed on the plurality of first semiconductor chips 140. A plurality of third bond pads BP3 may be formed on the plurality of connection members CP. A first bond insulation layer BO1 surrounding the plurality of first bond pads BP1 may be formed on the plurality of first semiconductor chips 140 and the first molding layer MD1. The first bond pads BP1 and the third bond pads BP3 may be formed by, for example, sputtering and/or electroplating. The first bond insulation layer BO1 may be formed, for example, by chemical vapor deposition (CVD). The material of the first molding layer MD1 may support a temperature of about 300° C. or greater while the first bond insulation layer BO1 is being formed, may have a thermal expansion coefficient of about 10 ppm/° C. or less, and may be selected as a material that has good adhesion with the first bond insulation layer BO1. By the above operations, a first wafer structure WS1 may be formed, including the plurality of first semiconductor chips 140, the plurality of connection members CP, the first molding layer MD1 surrounding the plurality of first semiconductor chips 140 and the plurality of connection members CP, the plurality of first bond pads BP1 on the plurality of first semiconductor chips 140, the plurality of third bond pads BP3 on the plurality of connection members CP, and the first bond insulation layer BO1 on the plurality of first semiconductor chips 140 and the first molding layer MD1.

Referring to FIG. 17D, a second wafer structure WS2 may be formed, including a plurality of second semiconductor chips 150, a plurality of second bond pads BP2 on the plurality of second semiconductor chips 150, a plurality of fourth bond pads BP4 on the plurality of second semiconductor chips 150, and the second bond insulation layer BO2 located on the plurality of second semiconductor chips 150 and surrounding the plurality of second bond pads BP2 and the plurality of fourth bond pads BP4. In detail, the plurality of second semiconductor chips 150 may be formed by forming a plurality of semiconductor devices 152 on a wafer W. The plurality of second semiconductor chips 150 may share the single wafer W. In other words, a substrate 151 of each of the second semiconductor chips 150 may be a portion of the same wafer W. The plurality of second bond pads BP2 and the plurality of fourth bond pads BP4 may be formed on the plurality of second semiconductor chips 150. The plurality of second bond pads BP2 and the plurality of fourth bond pads BP4 may be formed by, for example, sputtering and/or electroplating. The second bond insulation layer BO2 surrounding the plurality of second bond pads BP2 and the plurality of fourth bond pads BP4 may be formed on the plurality of second semiconductor chips 150. The second bond insulation layer BO2 may be formed by, for example, CVD.

Referring to FIGS. 17E and 17F, the first wafer structure WS1 may be bonded to the second wafer structure WS2. According to some embodiments, the first bond insulation layer BO1 may be first combined with the second bond insulation layer BO2. For example, the first bond insulation layer BO1 may be combined with the second bond insulation layer BO2 by applying a relatively low pressure (about 1 kN or less) at room temperature (about 25° C.). According to some embodiments, when the first bond insulation layer BO1 has been bonded to the second bond insulation layer BO2, the first bond pads BP1 and the third bond pads BP3 may be dented upwards from the lower surface of the first bond insulation layer BO1. The second bond pads BP2 and the fourth bond pads BP4 may be dented downwards from the upper surface of the second bond insulation layer BO2. Accordingly, the first bond pads BP1 may not be bonded to the second bond pads BP2, and the third bond pads BP3 may not be bonded to the fourth bond pads BP4. Next, for example, the first bond pads BP1 may be bonded to the second bond pads BP2 and the third bond pads BP3 may be bonded to the fourth bond pads BP4 by increasing a temperature up to about 300° C. In other words, an operation of bonding the first bond insulation layer BO1 to the second bond insulation layer BO2 may be performed at a first temperature, an operation of bonding the plurality of first bond pads BP1 and the plurality of third bond pads BP3 to the plurality of second bond pads BP2 and the plurality of fourth bond pads BP4 may be performed at a second temperature, and the second temperature (for example, about 300° C.) may be higher than the first temperature (for example, about 25° C.).

According to another embodiment, as shown in FIG. 5, the first bond pads BP1 may protrude upwards from the upper surface of the first bond insulation layer BO1, and the second bond pads BP2 may protrude downwards from the lower surface of the second bond insulation layer BO2. Accordingly, even when the first bond pads BP1 contact the second bond pads BP2, the first bond insulation layer BO1 may be spaced apart from the second bond insulation layer BO2. Accordingly, the first bond pads BP1 may be bonded to the second bond pads BP2, but the first bond insulation layer BO1 may not be bonded to the second bond insulation layer BO2.

When the first wafer structure WS1 is bonded to the second wafer structure WS2, misalignment between the first wafer structure WS1 and the second wafer structure WS2 may occur. The misalignment between the first wafer structure WS1 and the second wafer structure WS2 may be about 100 nm or less. As shown in FIG. 3B, the misalignment between the first wafer structure WS1 and the second wafer structure WS2 may lead to misalignment between the first bond pads BP1 and the second bond pads BP2.

Figure 17G:
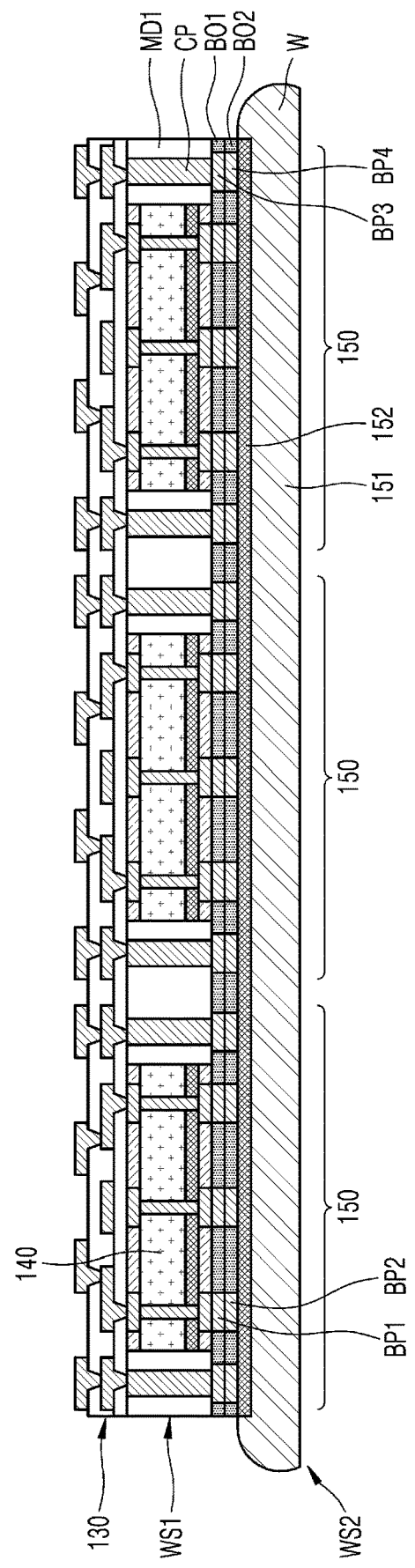

Referring to FIGS. 17E and 17G, the carrier CR may be separated from the first wafer structure WS1. Next, the first connection structure 130 may be formed on the first wafer structure WS1. To decrease the thickness of the wafer W, a portion of the wafer W may be removed, for example, grounded.

Figure 17H:
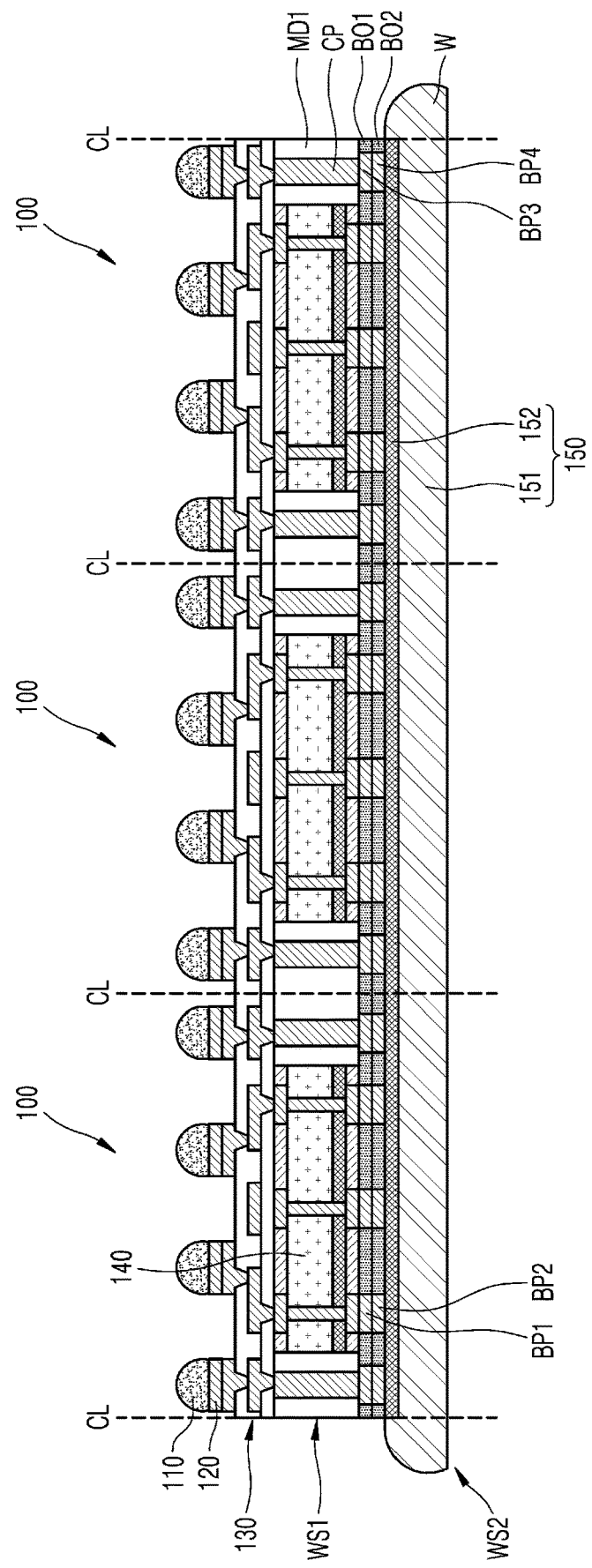

Referring to FIG. 17H, a plurality of terminal pads 120 may be formed on the first connection structure 130. Next, a plurality of external connection terminals 110 may be formed on the plurality of terminal pads 120, respectively. The plurality of external connection terminals 110 may be formed by, for example, reflowing solder balls. By cutting/dicing the first connection structure 130, the first wafer structure WS1, and the second wafer structure WS2 together along the cutting lines CL, the plurality of first semiconductor chips 140 and the plurality of second semiconductor chips 150 may be divided into a plurality of semiconductor packages 100 of FIG. 1. According to the semiconductor package fabricating method described with reference to FIGS. 17A through 17H, the semiconductor packages 100 of FIG. 1 may be formed. When the first semiconductor chips 140 may be replaced by the semiconductor chip stacks 140S of FIG. 14, semiconductor packages 100J of FIG. 14 may be formed.

According to the semiconductor package fabricating method described with reference with FIGS. 17A through 17H, the plurality of first semiconductor chips 140 may be handled as a single first wafer structure WS1, the plurality of second semiconductor chips 150 may be handled as a single second wafer structure WS2, and the first wafer structure WS1 may be directly bonded to the second wafer structure WS2. By handling the plurality of first and second semiconductor chips 140 and 150 as the first and second wafer structures WS1 and WS2, a problem due to particles generated in an operation of cutting the wafer W to obtain the first and second semiconductor chips 140 and 150 and an operation of individually handling the first and second semiconductor chips 140 and 150 may be prevented or reduced. Wafer-wafer direct bonding may be more favorable than chip-wafer direct bonding in that the number of times a bonding process is performed may be significantly reduced and throughput of the bonding process may improve. Wafer-wafer direct bonding may be more favorable than chip-wafer direct bonding because the wafer-wafer direct bonding may be easier or more accurate than the chip-wafer direct bonding.

Figure 18A:
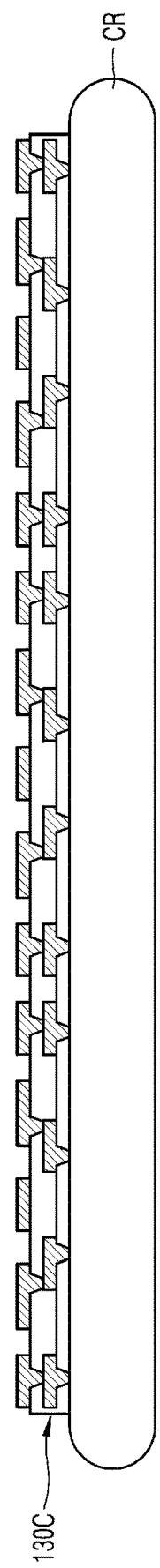
FIGS. 18A through 18D are cross-sectional views illustrating a method of fabricating a packaged semiconductor device, according to an embodiment of the inventive concept.
Figure 18B:
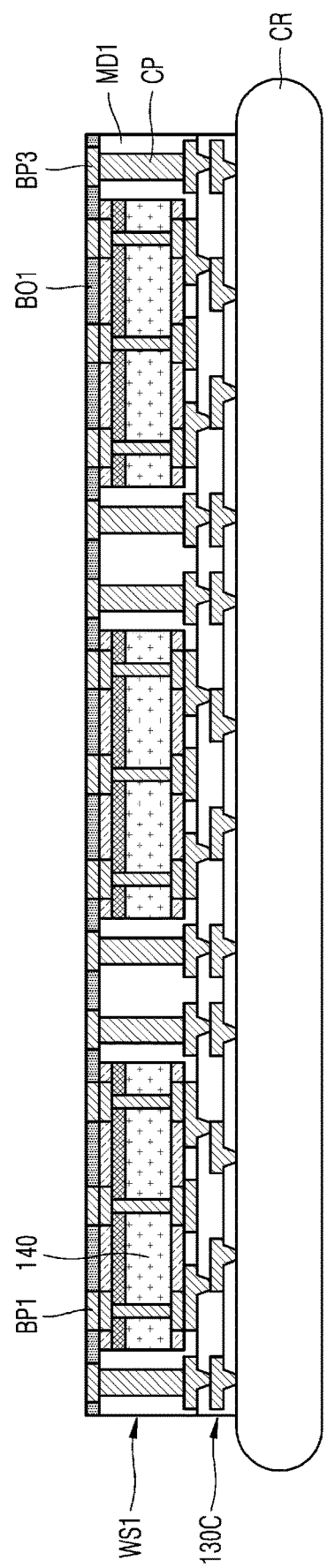
Figure 18C:
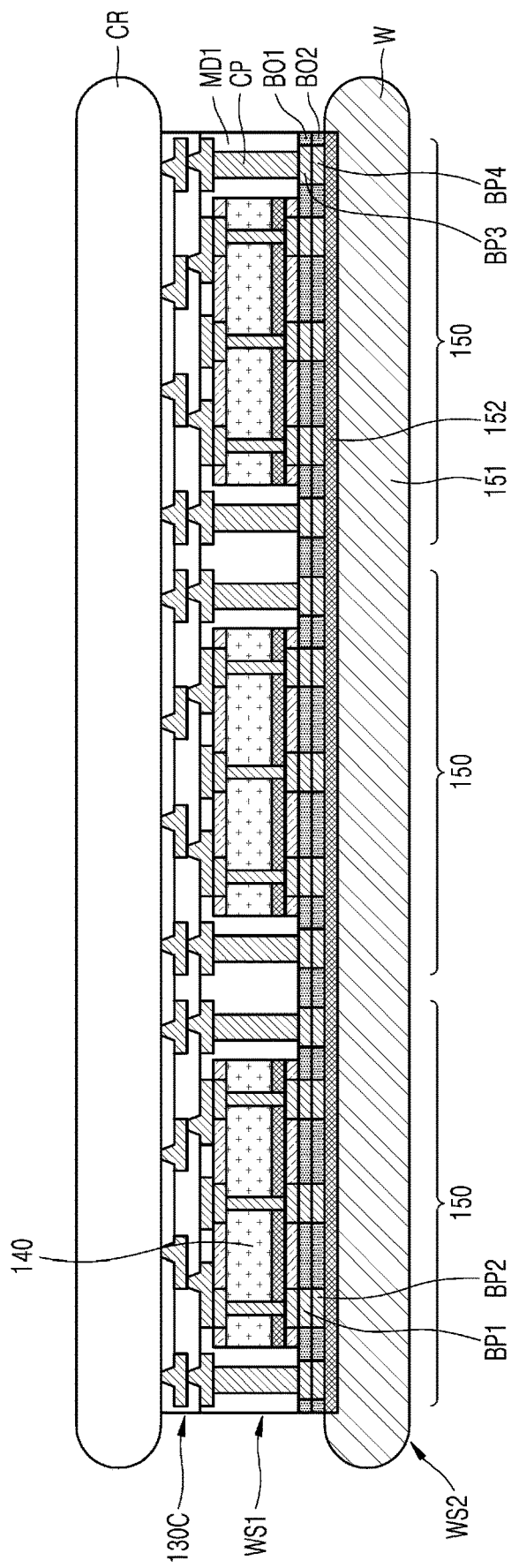

FIGS. 18A through 18D are cross-sectional views illustrating a method of fabricating a semiconductor package, according to an embodiment of the inventive concept. A difference between the semiconductor package fabricating method described with reference to FIGS. 17A through 17H and the semiconductor package fabricating method described with reference to FIGS. 18A through 18D will now be described. Referring to FIG. 18A, the first connection structure 130C may be formed on the carrier CR. Referring to FIG. 18B, the first wafer structure WS1 may be formed on the first connection structure 130C. Referring to FIG. 18C, the first wafer structure WS1 may be bonded to the second wafer structure WS2.

Figure 18D:
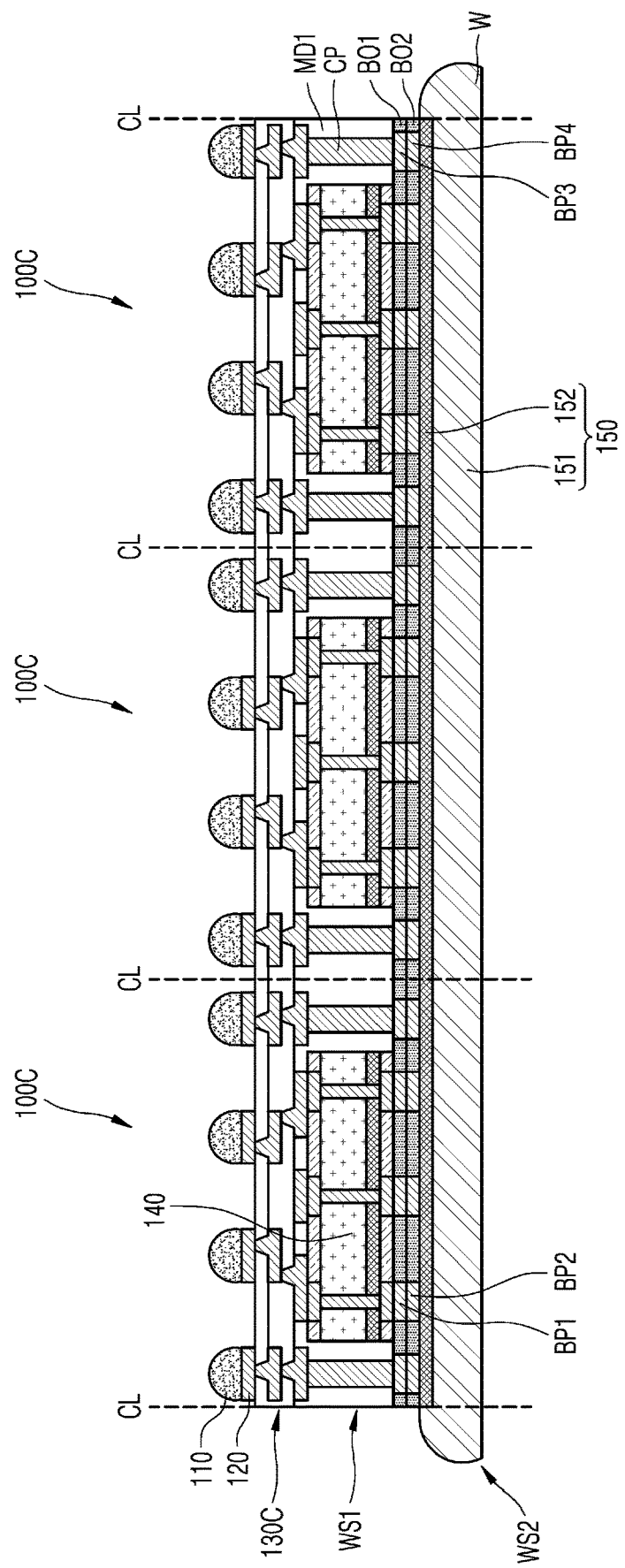

Referring to FIGS. 18C and 18D, the carrier CR may be separated from the first connection structure 130C. A lower portion of the second wafer structure WS2 may be removed to reduce the thickness of the wafer W. A plurality of terminal pads 120 may be formed on the first connection structure 130C. Next, a plurality of external connection terminals 110 may be formed on the plurality of terminal pads 120. Next, a plurality of semiconductor packages 100C may be obtained by cutting the first connection structure 130C, the first wafer structure WS1, and the second wafer structure WS2 along cutting lines CL. According to the semiconductor package fabricating method described with reference to FIGS. 18A through 18D, the first connection structure 130C is first formed, and then the first wafer structure WS1 may be formed on the first connection structure 130C. Accordingly, the first connection structure 130C may have an RDL first structure, and semiconductor packages 100C of FIG. 7 may be formed.

Figure 19:
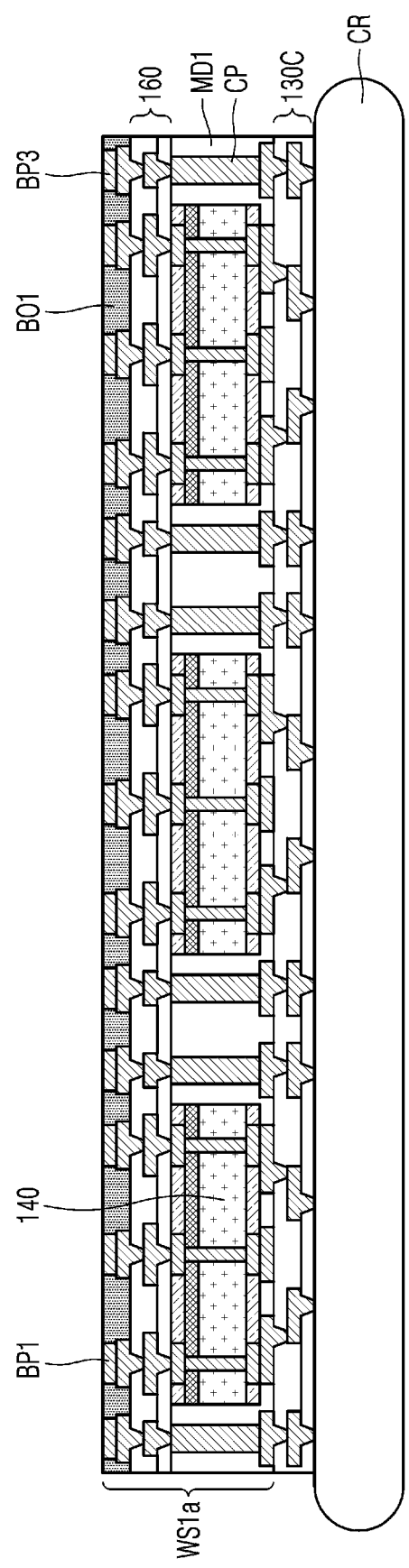
FIG. 19 is a cross-sectional view illustrating a packaged semiconductor device fabricating method according to an embodiment of the inventive concept.

FIG. 19 is a cross-sectional view illustrating a semiconductor package fabricating method according to an embodiment of the inventive concept. A difference between the semiconductor package fabricating method described with reference to FIGS. 17A through 17H and the semiconductor package fabricating method described with reference to FIG. 19 will now be described. Referring to FIG. 19, the semiconductor package 100D of FIG. 8 may be formed using a first wafer structure WS1a instead of the first wafer structure WS1 of FIGS. 17A through 17H. The first wafer structure WS1a may further include the second connection structure 160 between the first molding layer MD1 and the first bond insulation layer BO1. In detail, the first connection structure 130C may be formed on the carrier CR, the plurality of first semiconductor chips 140 and the plurality of connection members CP may be arranged on the first connection structure 130C, and the first molding layer MD1 surrounding the plurality of first semiconductor chips 140 and the plurality of connection members CP may be formed on the first connection structure 130C. Next, the second connection structure 160 may be formed on the plurality of first semiconductor chips 140, the plurality of connection members CP, and the first molding layer MD1. Next, the plurality of first bond pads BP1, the plurality of third bond pads BP3, and the first bond insulation layer BO1 may be formed on the second connection structure 160.

Figure 20A:
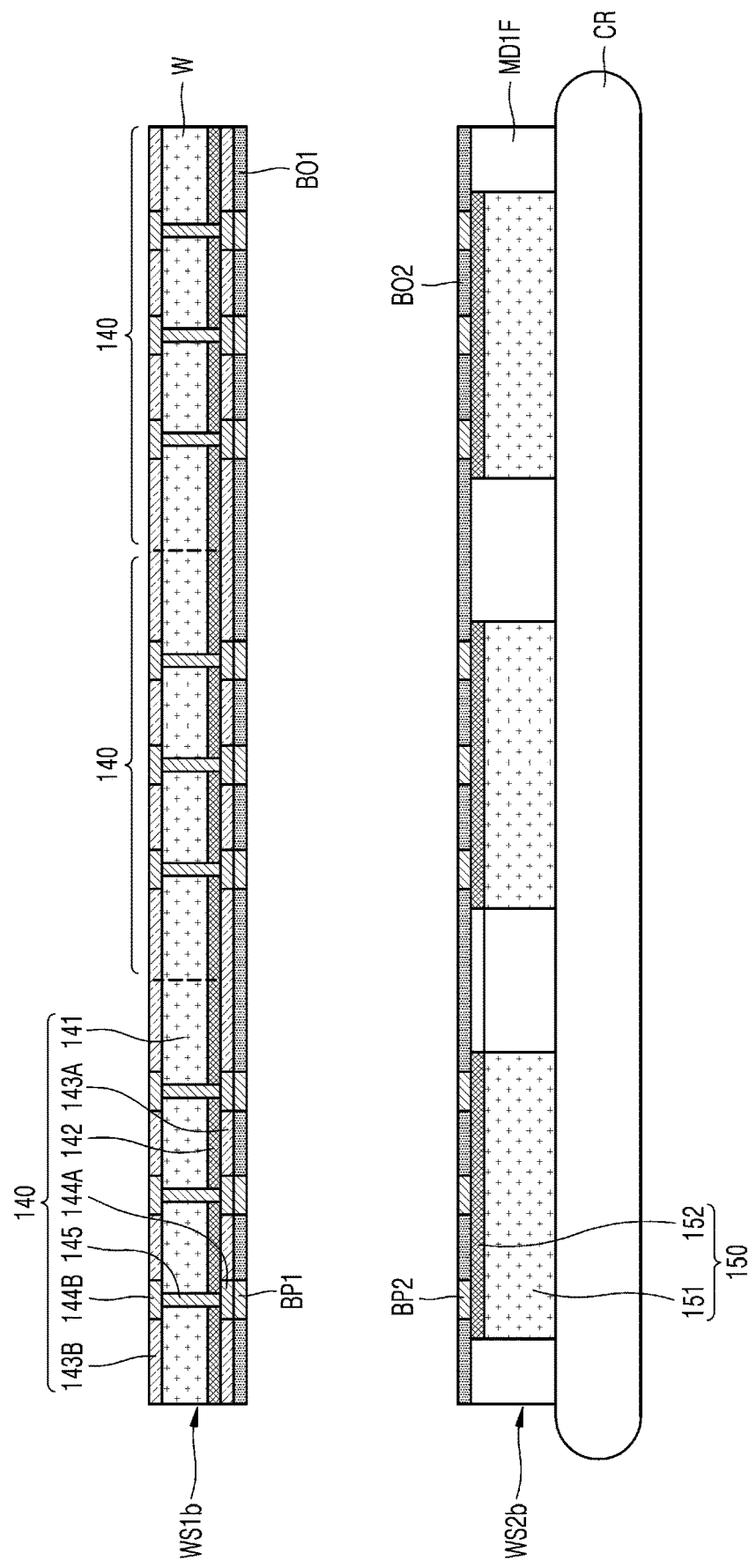
FIGS. 20A and 20B are cross-sectional views illustrating a semiconductor package fabricating method, according to an embodiment of the inventive concept.
Figure 20B:
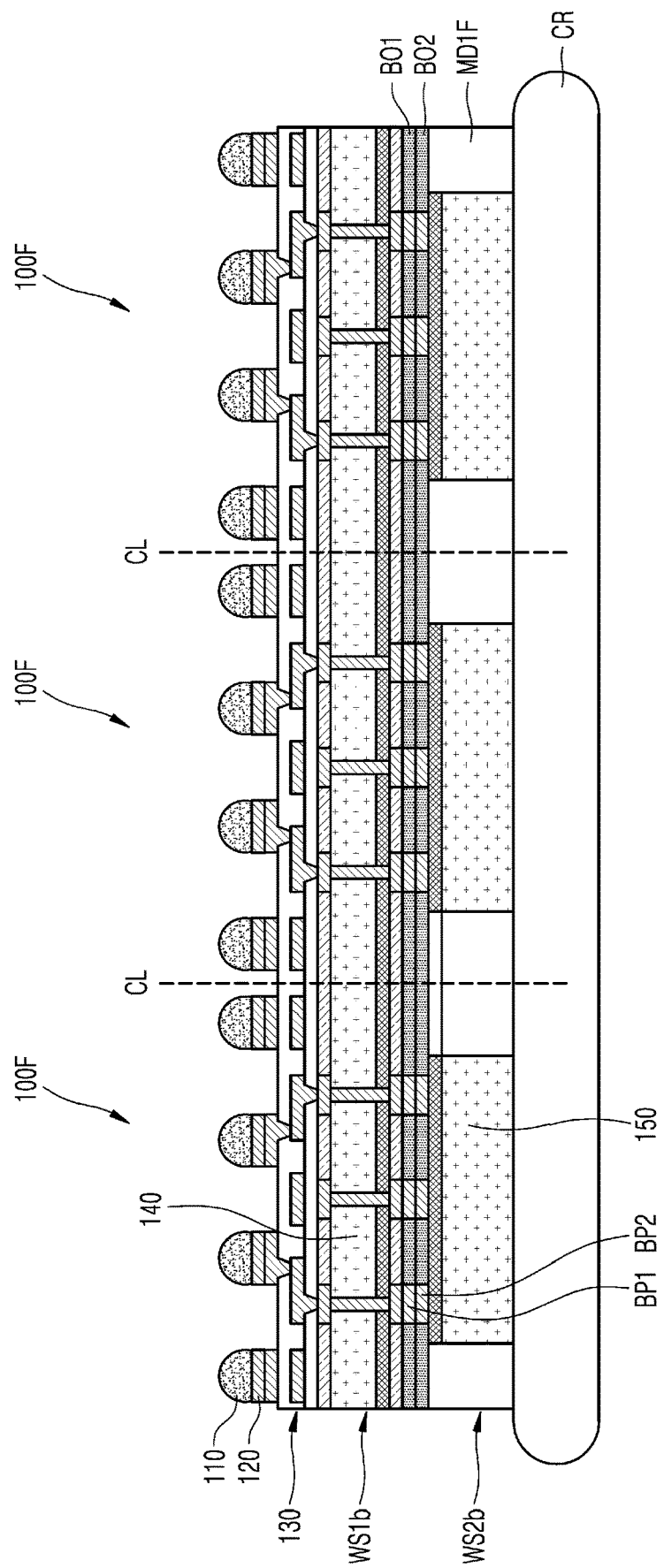

FIGS. 20A and 20B are cross-sectional views illustrating a semiconductor package fabricating method, according to an embodiment of the inventive concept. A difference between the semiconductor package fabricating method described with reference to FIGS. 17A through 17H and the semiconductor package fabricating method described with reference to FIGS. 20A and 20B will now be described.

Referring to FIG. 20A, a first wafer structure WS1b may include the plurality of first semiconductor chips 140, the plurality of first bond pads BP1 on the plurality of first semiconductor chips 140, and the first bond insulation layer BO1 located on the plurality of first semiconductor chips 140 and surrounding the plurality of first bond pads BP1. In detail, the plurality of first semiconductor chips 140 may be formed by forming a plurality of semiconductor devices 142 on the wafer W, forming TSVs 145 penetrating through the wafer W, forming first and second chip pads 144A and 144B on both sides of the wafer W, respectively, and forming first and second chip insulation layers 143A and 143B on both sides of the wafer W, respectively. The plurality of semiconductor devices 142 may share the wafer W. In other words, the substrate 141 of each of the second semiconductor chips 140 may be a portion of the wafer W. The plurality of first bond pads BP1 may be formed on the plurality of first chip pads 144A. The first bond insulation layer BO1 surrounding the plurality of first bond pads BP1 may be formed on the plurality of first semiconductor chips 140.

A second wafer structure WS2b may include the plurality of second semiconductor chips 150, a first molding layer MD1F surrounding the plurality of second semiconductor chips 150, the plurality of second bond pads BP2 on the plurality of second semiconductor chips 150, and the second bond insulation layer BO2 located on the plurality of second semiconductor chips 150 and the first molding layer MD1F and surrounding the plurality of second bond pads BP2. In detail, the plurality of first semiconductor chips 150 may be arranged on the carrier CR. Next, the first molding layer MD1F surrounding the plurality of second semiconductor chips 150 may be formed on the carrier CR. Next, the plurality of second bond pads BP2 may be formed on the plurality of second semiconductor chips 150. The second bond insulation layer BO2 surrounding the plurality of second bond pads BP2 may be formed on the plurality of second semiconductor chips 150 and the first molding layer MD1F.

Referring to FIG. 20B, the first wafer structure WS1b may be bonded to the second wafer structure WS2b such that the plurality of first bond pads BP1 directly contact the plurality of second bond pads BP2. The first connection structure 130 may be formed on the first wafer structure WS1b. Next, the plurality of terminal pads 120 may be formed on the first connection structure 130. The plurality of external connection terminals 110 may be formed on the plurality of terminal pads 120, respectively. The carrier CR may be separated from the second wafer structure WS2b. A plurality of semiconductor packages 100F may be obtained by cutting the first connection structure 130, the first wafer structure WS1b, and the second wafer structure WS2b along cutting lines CL. According to the semiconductor package fabricating method described with reference to FIGS. 20A and 20B, the semiconductor packages 100F of FIG. 10 may be formed.

Figure 21:
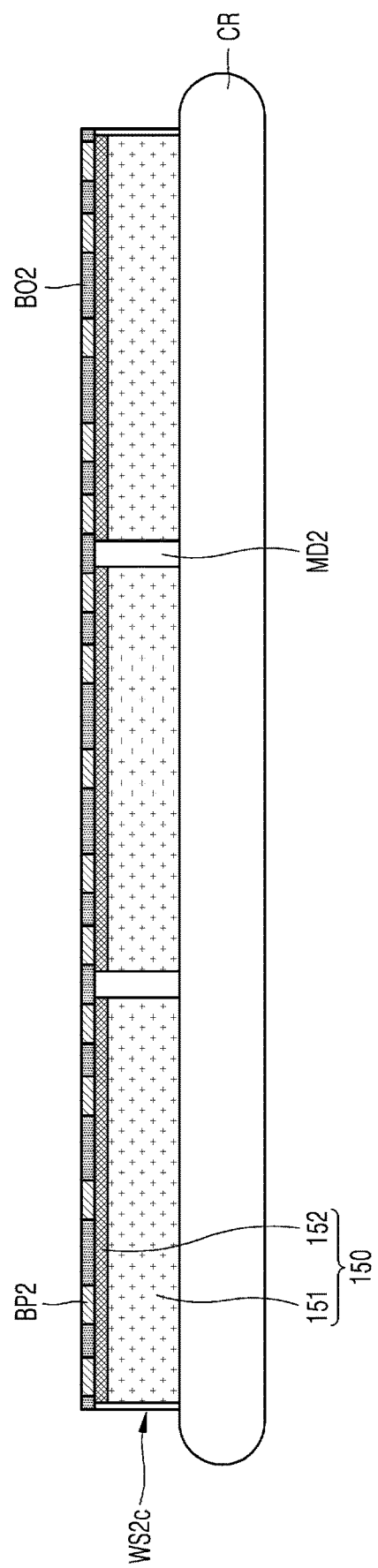
FIG. 21 is a cross-sectional view illustrating a semiconductor package fabricating method according to an embodiment of the inventive concept.

FIG. 21 is a cross-sectional view illustrating a semiconductor package fabricating method according to an embodiment of the inventive concept. A difference between the semiconductor package fabricating method described with reference to FIGS. 17A through 17H and the semiconductor package fabricating method described with reference to FIG. 21 will now be described. Referring to FIG. 21, semiconductor packages 100E of FIG. 9 may be formed using a second wafer structure WS2c instead of the second wafer structure WS2 of FIG. 17D. A second wafer structure WS2c may include the plurality of second semiconductor chips 150, a second molding layer MD2 surrounding the plurality of second semiconductor chips 150, the plurality of second bond pads BP2 on the plurality of second semiconductor chips 150, and the second bond insulation layer BO2 located on the plurality of second semiconductor chips 150 and the second molding layer MD2 and surrounding the plurality of second bond pads BP2. In detail, the plurality of first semiconductor chips 150 may be arranged on the carrier CR. Next, the second molding layer MD2 surrounding the plurality of second semiconductor chips 150 may be formed on the carrier CR. Next, the plurality of second bond pads BP2 may be formed on the plurality of second semiconductor chips 150. Next, the second bond insulation layer BO2 surrounding the plurality of second bond pads BP2 may be formed on the plurality of second semiconductor chips 150 and the second molding layer MD2.

Figure 22:
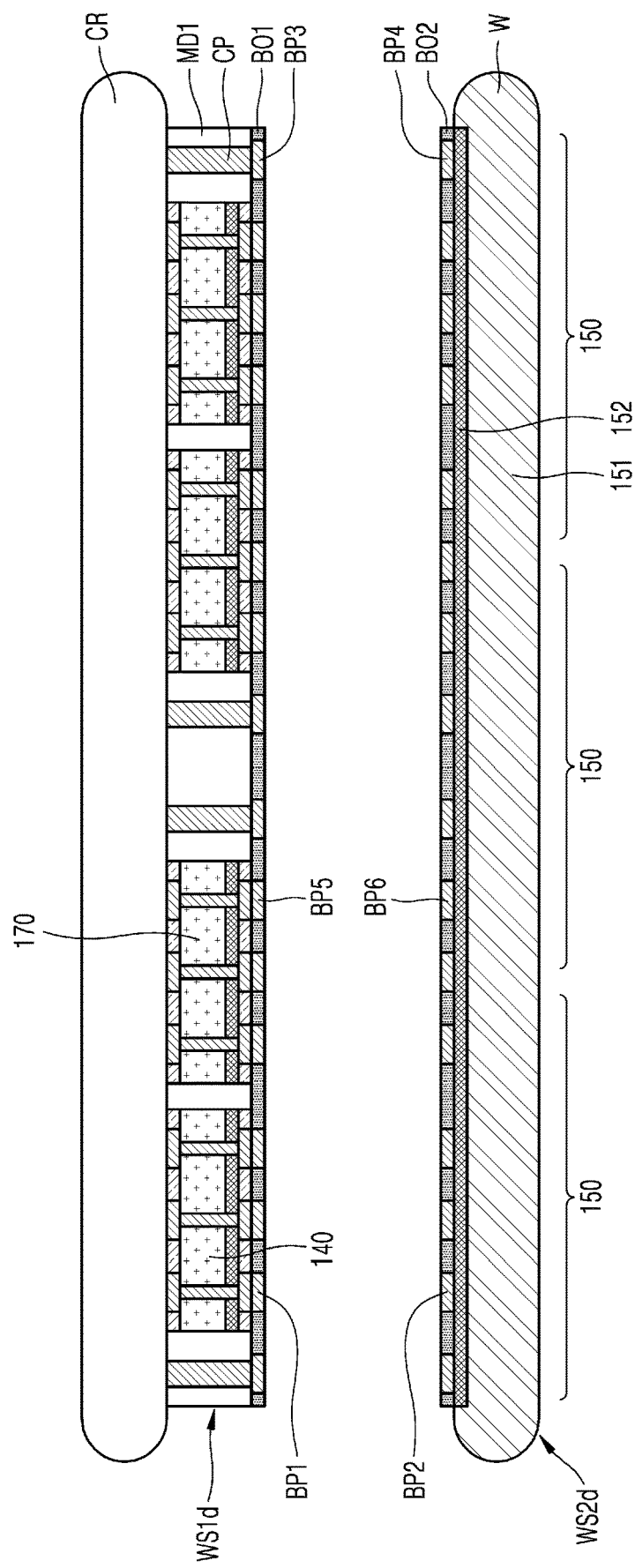
FIG. 22 is a cross-sectional view illustrating a semiconductor package fabricating method according to an embodiment of the inventive concept.

FIG. 22 is a cross-sectional view illustrating a semiconductor package fabricating method according to an embodiment of the inventive concept. A difference between the semiconductor package fabricating method described with reference to FIGS. 17A through 17H and the semiconductor package fabricating method described with reference to FIG. 22 will now be described. Referring to FIG. 22, semiconductor packages 100G of FIG. 11 may be formed using a first wafer structure WS1d and a second wafer structure WS2d instead of the first wafer structure WS1 and the second wafer structure WS2 of FIGS. 17A through 17H.

The first wafer structure WS1d may further include a plurality of third semiconductor chips 170, and a plurality of fifth bond pads BP5 on the plurality of third semiconductor chip 170. In detail, the plurality of third semiconductor chips 170, the plurality of first semiconductor chips 140, and the plurality of connection members CP may be arranged on the carrier CR. Next, a first molding layer MD1 surrounding the plurality of third semiconductor chips 170, the plurality of first semiconductor chips 140, and the plurality of connection members CP may be formed on the carrier CR. Next, the plurality of first bond pads BP1 may be formed on the plurality of first semiconductor chip 140, the plurality of third bond pads BP3 may be formed on the plurality of connection members CP, and the plurality of fifth bond pads BP5 may be formed on the plurality of third semiconductor chips 170. The first bond insulation layer BO1 may be formed on the first molding layer MD1, the plurality of first semiconductor chips 140, and the plurality of third semiconductor chips 170.

The second wafer structure WS2d may further include a plurality of sixth bond pads BP6 on the plurality of second semiconductor chips 150. The sixth bond pads BP6 may be formed simultaneously with the second bond pads BP2 and the fourth bond pads BP4. When the first wafer structure WS1 is bonded to the second wafer structure WS2, the plurality of sixth bond pads BP6 may contact the plurality of fifth bond pads BP5, respectively.

Figure 23:
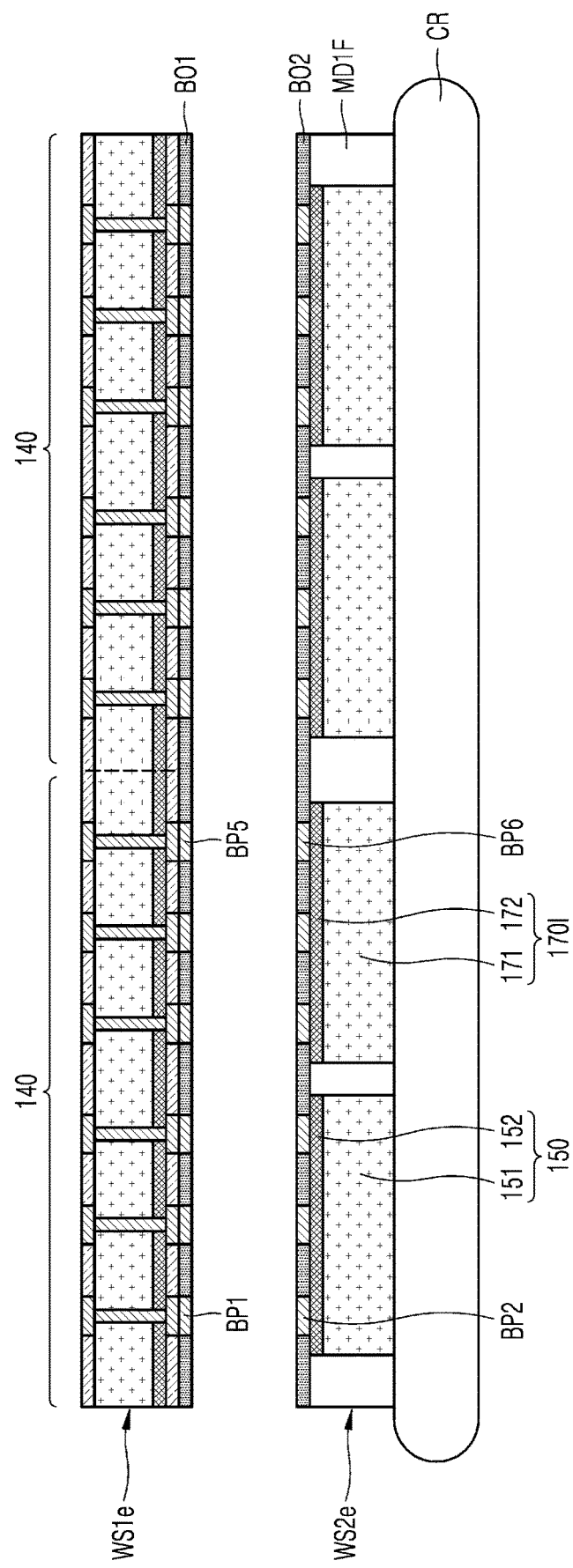
FIG. 23 is a cross-sectional view illustrating a semiconductor package fabricating method according to an embodiment of the inventive concept.

FIG. 23 is a cross-sectional view illustrating a semiconductor package fabricating method according to an embodiment of the inventive concept. A difference between the semiconductor package fabricating method described with reference to FIGS. 20A and 20B and the semiconductor package fabricating method described with reference to FIG. 23 will now be described. Referring to FIG. 23, semiconductor packages 100I of FIG. 13 may be formed using a first wafer structure WS1e and a second wafer structure WS2e instead of the first wafer structure WS1b and the second wafer structure WS2b of FIGS. 20A and 20B.

The first wafer structure WS1e may further include the plurality of sixth bond pads BP5 on the plurality of first semiconductor chips 140. The second wafer structure WS2e may further include a plurality of third semiconductor chips 170 surrounded by a first molding layer MD1F, and a plurality of sixth bond pads BP6 on the plurality of third semiconductor chips 170. In detail, the plurality of first semiconductor chips 140 and the plurality of third semiconductor chips 170 may be arranged on the carrier CR. Next, a first molding layer MD1 surrounding the plurality of third semiconductor chips 140 and the plurality of first semiconductor chips 170 may be formed on the carrier CR. Next, the plurality of second bond pads BP2 may be formed on the plurality of first semiconductor chips 140, and the plurality of sixth bond pads BP6 may be formed on the plurality of third semiconductor chips 170. A second bond insulation layer BO2 surrounding the plurality of second bond pads BP2 and the plurality of sixth bond pads BP6 may be formed on the plurality of first semiconductor chips 140, the plurality of third semiconductor chips 170, and the first molding layer MD1. When the first wafer structure WS1$e$ is bonded to the second wafer structure WS2$e$, the plurality of fifth bond pads BP5 may contact the plurality of sixth bond pads BP6, respectively.

Figure 24:
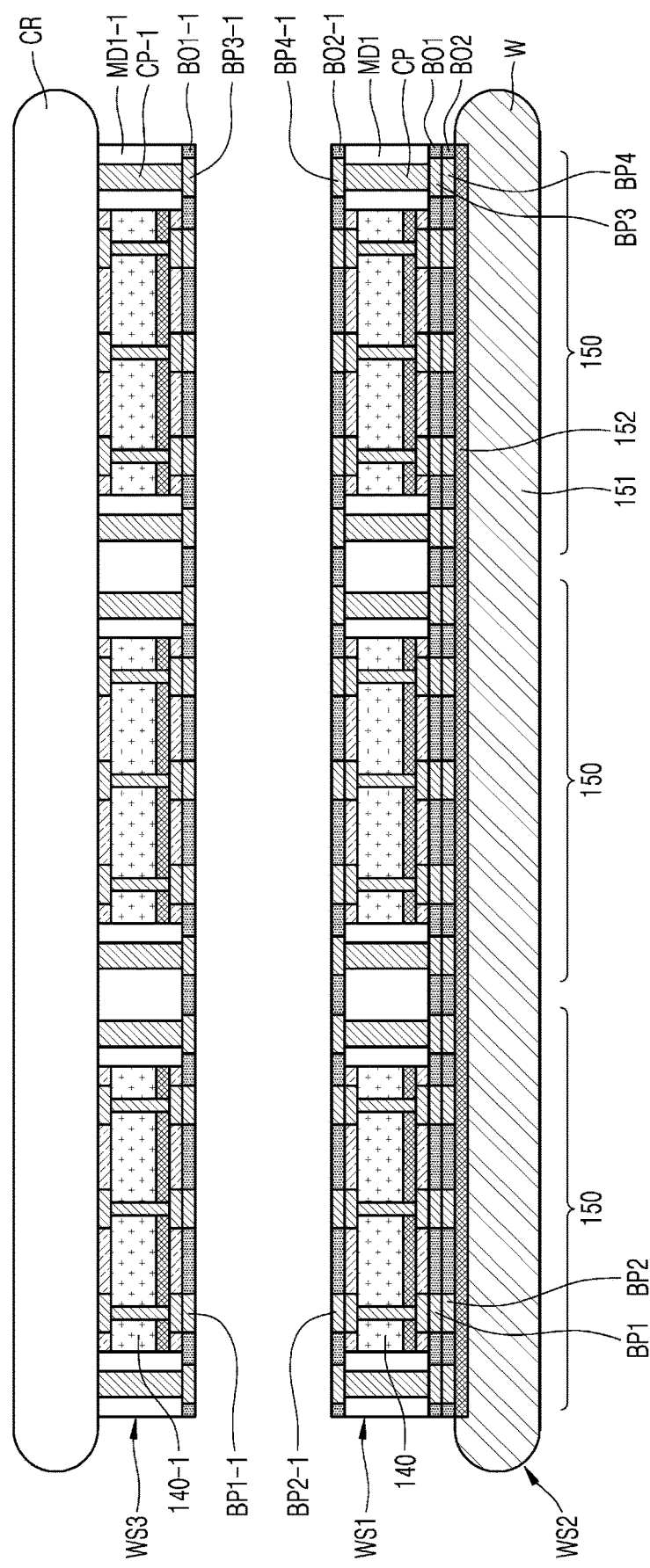
FIG. 24 is a cross-sectional view illustrating a semiconductor package fabricating method according to an embodiment of the inventive concept.

FIG. 24 is a cross-sectional view illustrating a semiconductor package fabricating method according to an embodiment of the inventive concept. A difference between the semiconductor package fabricating method described with reference to FIGS. 17A through 17H and the semiconductor package fabricating method described with reference to FIG. 24 will now be described. Referring to FIG. 24, as shown in FIGS. 17A through 17E, the first wafer structure WS1 and the second wafer structure WS2 may be formed, the first wafer structure WS1 may be bonded to the second wafer structure WS2, and the carrier CR may be separated from the first wafer structure WS1. The additional bond pads BP2-1 and BP4-1 and the second additional bond insulation layer BO2-1 may be formed on the first wafer structure WS1. According to the semiconductor package fabricating method described with reference to FIGS. 17A through 17H, an additional wafer structure WS3 may be prepared. The additional wafer structure WS3 may include a plurality of additional semiconductor chips 140-1, a plurality of additional connection members CP-1, an additional molding layer MD1-1 surrounding the plurality of additional semiconductor chips 140-1 and the plurality of additional connection members CP-1, a plurality of first additional bond pads BP1-1 on the plurality of additional semiconductor chips 140-1, a plurality of third additional bond pads BP3-1 on the plurality of additional connection members CP-1, and the first additional bond insulation layer BO1-1 located on the plurality of additional semiconductor chips 140-1 and the additional molding layer MD1-1 and surrounding the plurality of first additional bond pads BP1-1 and the plurality of third additional bond pads BP3-1. The third wafer structure WS3 may be bonded to the first wafer structure WS1 such that the plurality of first additional bond pads BP1-1 contact the plurality of second additional bond pads BP2-1, respectively, and the plurality of third additional bond pads BP3-1 contact the plurality of fourth additional bond pads BP4-1, respectively. The first additional bond insulation layer BO1-1 may be bonded to the second additional bond insulation layer BO-2 or may be separated from the second additional bond insulation layer BO-2. By sequentially bonding a plurality of wafer structures in this way, semiconductor packages 100K of FIG. 15 may be manufactured.

Figure 25A:
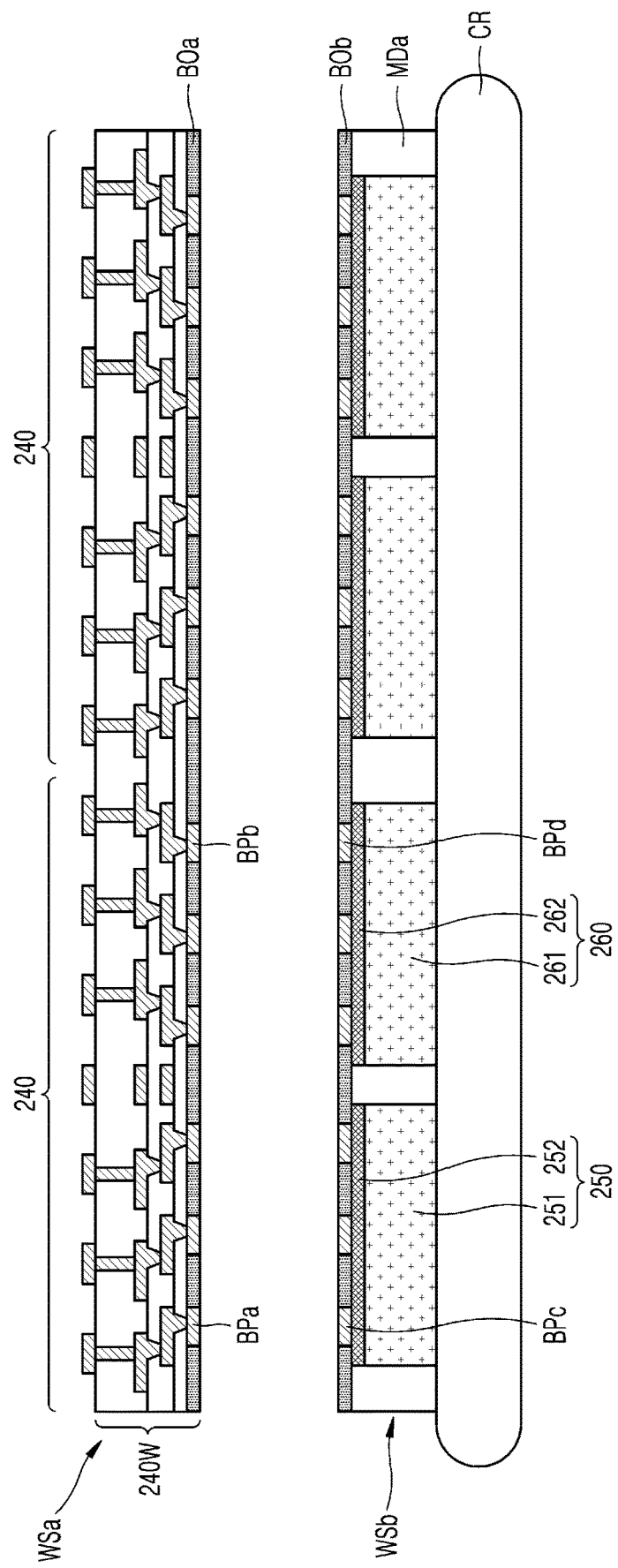
FIGS. 25A and 25B are cross-sectional views illustrating a semiconductor package fabricating method, according to an embodiment of the inventive concept.
Figure 25B:
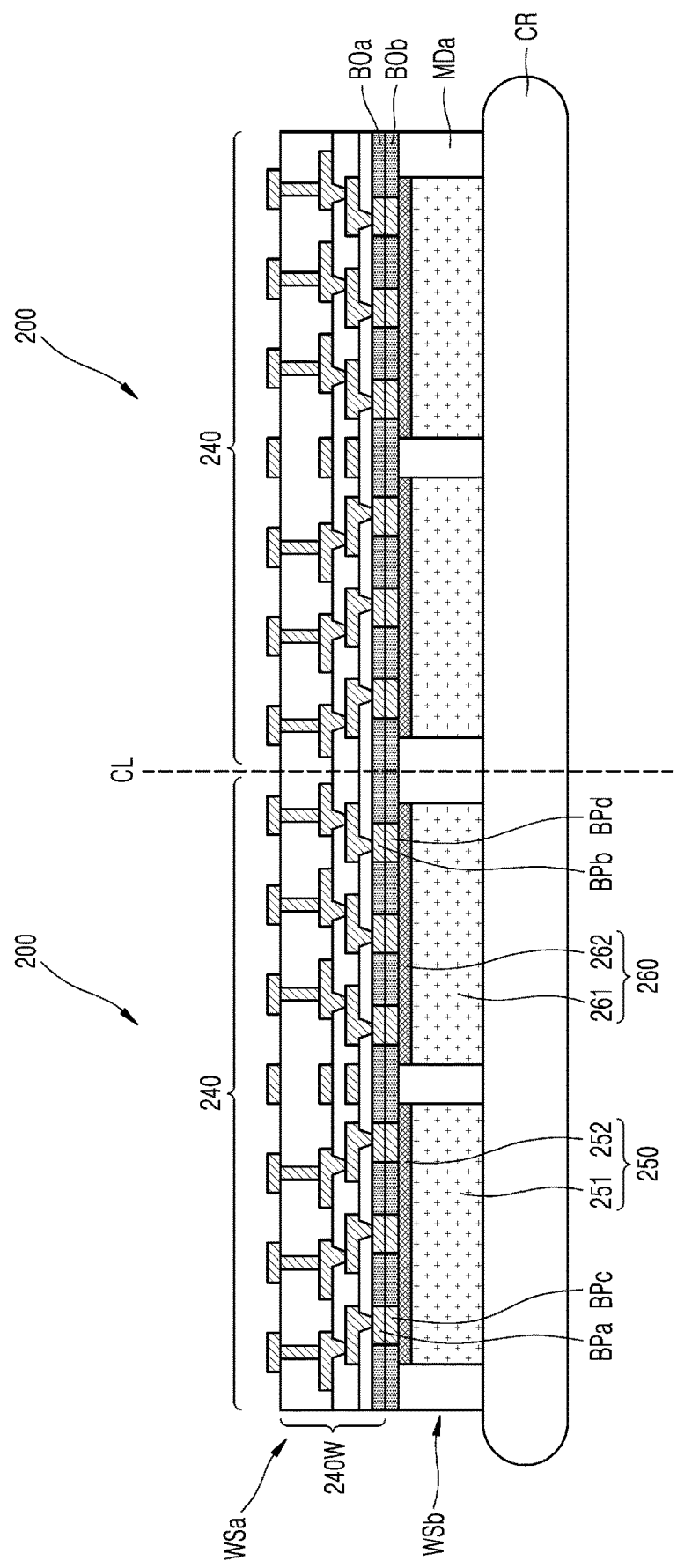

FIGS. 25A and 25B are cross-sectional views illustrating a semiconductor package fabricating method, according to an embodiment of the inventive concept. Referring to FIG. 25A, a first wafer structure WSa is formed, including an interposer wafer 240W including a plurality of interposers 24, a plurality of first bond pads BPa on the interposer wafer 240W, a plurality of second bond pads BPb on the interposer wafer 240W, and a first bond insulation layer BOa surrounding the plurality of first bond pads BPa and the plurality of second bond pads BPb on the interposer wafer 240W. In detail, the interposer wafer 240W including the plurality of interposers 240 may be prepared. Next, the plurality of first bond pads BPa and the plurality of second bond pads BPb may be formed on the interposer wafer 240W. The first bond insulation layer BOa surrounding the plurality of first bond pads BPa and the plurality of second bond pads BPb may be formed on the interposer wafer 240W.

A second wafer structure WSb is prepared, including a plurality of first semiconductor chips 250, a plurality of second semiconductor chips 260, a first molding layer MDa surrounding the plurality of first semiconductor chips 250 and the plurality of second semiconductor chips 260, a plurality of third bond pads BPc on the plurality of first semiconductor chips 250, a plurality of fourth bond pads BPd on the plurality of second semiconductor chips 260, and a second bond insulation layer BOb surrounding the plurality of third bond pads BPc and the plurality of fourth bond pads BPd on the plurality of first semiconductor chips 250, the plurality of second semiconductor chips 260, and the first molding layer MDa. For example, the plurality of first semiconductor chips 250 and the plurality of second semiconductor chips 260 may be arranged on the carrier CR. Next, a first molding layer MDa surrounding the plurality of third semiconductor chips 250 and the plurality of first semiconductor chips 260 may be formed on the carrier CR. Next, the plurality of third bond pads BPc on the plurality of first semiconductor chips 250 and the plurality of fourth bond pads BPd on the plurality of second semiconductor chips 260 may be formed. The second bond insulation layer BOb surrounding the plurality of third bond pads BPc and the plurality of fourth bond pads BPd may be formed on the first molding layer MDa.

Referring to FIG. 25B, the first wafer structure WSa may be bonded to the second wafer structure WSb such that the plurality of first bond pads BPa contact the plurality of third bond pads BPc, respectively, and the plurality of second bond pads BPb contact the plurality of fourth bond pads BPd, respectively. The carrier CR may be separated from the second wafer structure WS2$b$. A plurality of semiconductor packages 200 may be obtained by cutting the first wafer structure WSa and the second wafer structure WSb along cutting lines CL.

Referring to FIG. 16, the interposer 240 may be attached to the package substrate 220 by using the plurality of internal connection members 230. The second molding layer MDb surrounding the interposer 240 and the first molding layer MDa may be formed on the package substrate 220. The external connection terminals 210 may be attached to the lower surface of the package substrate 220. Accordingly, semiconductor packages 200 of FIG. 16 may be formed.

According to the semiconductor package fabricating method described with reference with FIGS. 25A and 25B, the plurality of first semiconductor chips 250 and the plurality of second semiconductor chips 260 may be handled as a single second wafer structure WSb, the plurality of interposers 240 may be handled as a single first wafer structure WSa, and the first wafer structure WSa may be directly bonded to the second wafer structure WSb. By handling the plurality of first and second semiconductor chips 250 and 260 and the plurality of interposers 240 as the first and second wafer structures WSa and WSb, a problem due to particles generated in an operation of cutting a wafer to obtain the first and second semiconductor chips 250 and 260 and the interposers 240 and an operation of individually handling the first and second semiconductor chips 250 and 260 and the interposers 240 may be prevented or reduced. Wafer-wafer direct bonding may be more favorable than chip-wafer direct bonding in that the number of times a bonding process is performed may be significantly reduced and throughput of the bonding process may improve. Wafer-wafer direct bonding may be more favorable than chip-wafer direct bonding because the wafer-wafer direct bonding may be easier or more accurate than the chip-wafer direct bonding.

While the inventive concept has been particularly shown and described with reference to embodiments thereof, it will be understood that various changes in form and details may be made therein without departing from the spirit and scope of the following claims.

What is claimed is:

1. A packaged semiconductor device, comprising:
   a connection structure;
   a first semiconductor chip on an upper surface of the connection structure;
   a first bond pad on the first semiconductor chip;
   a first electrically conductive through substrate via (TSV), which extends through a substrate of the first semiconductor chip and is electrically connected to the first bond pad;
   a first bond insulation layer, which extends on the first semiconductor chip and at least partially surrounds the first bond pad;
   a second bond pad directly contacting the first bond pad;
   a second bond insulation layer at least partially surrounding the second bond pad;
   a second semiconductor chip on the second bond pad and the second bond insulation layer, said second semiconductor chip comprising a substrate and a semiconductor device on the lower surface of the substrate; and
   a third semiconductor chip arranged beside the second semiconductor chip;
   a first molding layer located on the second bond insulation layer and at least partially surrounding the second semiconductor chip and the third semiconductor chip.

2. The device of claim 1, wherein the second bond pad is misaligned with the first bond pad.

3. The device of claim 2, wherein an alignment error between the first bond pad and the second bond pad is within 100 nm.

4. The device of claim 1, wherein the third semiconductor chip located on the first bond insulation layer.

5. The device of claim 1, further comprising:
   a third bond pad located between the first semiconductor chip and the third semiconductor chip, and at least partially surrounded by the first bond insulation layer;
   a fourth bond pad located on the third bond pad and at least partially surrounded by the second bond insulation layer.

6. The device of claim 5, further comprising:
   a second electrically conductive TSV, which extends through the substrate of the first semiconductor chip and is electrically connected to the third bond pad.

7. The device of claim 5, wherein the fourth bond pad is directly contacting the third bond pad.

8. The device of claim 7, wherein the fourth bond pad is misaligned with the third bond pad.

9. The device of claim 8, wherein an alignment error between the third bond pad and the fourth bond pad is within 100 nm.

10. The device of claim 1, wherein a lateral surface of the first semiconductor chip is coplanar with a lateral surface of the first molding layer.

11. A packaged semiconductor device, comprising:
    a connection structure;
    a first semiconductor chip on an upper surface of the connection structure, said first semiconductor chip comprising a substrate, a semiconductor device on the substrate, a first through substrate via (TSV) penetrating through the substrate, and a chip pad on the lower surface of the substrate;
    a first bond pad on the first semiconductor chip;
    a first bond insulation layer at least partially surrounding the first bond pad
    a first molding layer located on the upper surface of the connection structure and at least partially surrounding the first semiconductor chip;
    a second bond pad directly contacting the first bond pad;
    a second bond insulation layer at least partially surrounding the second bond pad; and
    a second semiconductor chip on the second bond pad and the second bond insulation layer, said second semiconductor chip comprising a substrate and a semiconductor device on the lower surface of the substrate;
    wherein the chip pad is electrically connecting the first TSV and the connection structure.

12. The device of claim 11, wherein the second bond pad is misaligned with the first bond pad.

13. The device of claim 11, further comprising a third semiconductor chip located between the connection structure and the second semiconductor.

14. The device of claim 13, further comprising:
    a third bond pad located between the second semiconductor chip and the third semiconductor chip;
    a third bond insulation layer at least partially surrounding the third bond pad;
    a fourth bond pad located between the third bond pad and the second semiconductor chip and said directly contacting the third bond pad and at least partially surrounded by the second bond insulation layer; and
    a second TSV, which extends through the substrate of the second semiconductor chip and is electrically connected to the third bond pad.

15. The device of claim 14, wherein the third bond pad is misaligned with the fourth bond pad.

16. The device of claim 11, wherein the third semiconductor chip is arranged beside the first semiconductor chip.

17. The device of claim 11, further comprising an electrically conductive connection member (CP) extending through the first molding layer.

18. A packaged semiconductor device, comprising:
    a redistribution structure;
    a solder bump on a first surface of the redistribution structure;
    a first semiconductor chip on a second surface of the redistribution structure, said first semiconductor chip comprising a semiconductor substrate, a lower chip pad on a lower surface of the semiconductor substrate, an upper chip pad on an upper surface of the semiconductor substrate, and a through substrate via (TSV) extending through the semiconductor substrate, which extends between the lower chip pad and the upper chip pad;
    a first bond pad on the upper chip pad of the first semiconductor chip;

a first bond insulation layer on an upper surface of the first semiconductor chip and at least partially surrounding the first bond pad;
a second bond pad contacting the first bond pad;
a second bond insulation layer contacting the first bond insulation layer and at least partially surrounding the second bond pad; and
a second semiconductor chip on the second bond pad and the second bond insulation layer;
a third semiconductor chip arranged beside the second semiconductor chip; and
a first molding layer located on the second bond insulation layer and at least partially surrounding the second semiconductor chip and the third semiconductor chip.

19. The device of claim 18, The first and second bond pads include a metal material including copper (Cu), silver (Ag), gold (Au), tungsten (W), aluminum (Al), titanium (Ti), tantalum (Ta), or a combination thereof.

20. The device of claim 18, wherein the second bond pad is misaligned with the first bond pad; and wherein an alignment error between the first bond pad and the second bond pad is within about 100 nm.

* * * * *